(12) United States Patent
Kim et al.

(10) Patent No.: US 11,121,348 B2
(45) Date of Patent: Sep. 14, 2021

(54) ROTARY POLARIZED LIGHT EMITTING BODY, ROTARY POLARIZED LIGHT EMITTING DEVICE, AND MANUFACTURING METHOD THEREFOR

(71) Applicant: INDUSTRY-UNIVERSITY COOPERATION FOUNDATION HANYANG UNIVERSITY, Seoul (KR)

(72) Inventors: Jae-Hoon Kim, Seoul (KR); You-Jin Lee, Seoul (KR); Chang-Jae Yu, Seoul (KR)

(73) Assignee: INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 24 days.

(21) Appl. No.: 16/693,276

(22) Filed: Nov. 23, 2019

(65) Prior Publication Data

US 2020/0111997 A1   Apr. 9, 2020

Related U.S. Application Data

(63) Continuation of application No. PCT/KR2018/005812, filed on May 23, 2018.

(30) Foreign Application Priority Data

May 23, 2017 (KR) .................. 10-2017-0063675
Jun. 16, 2017 (KR) .................. 10-2017-0076752
May 17, 2018 (KR) .................. 10-2018-0056468

(51) Int. Cl.
*H01L 51/52* (2006.01)
*H01L 51/56* (2006.01)
(Continued)

(52) U.S. Cl.
CPC ...... *H01L 51/5293* (2013.01); *H01L 51/5206* (2013.01); *H01L 51/5221* (2013.01);
(Continued)

(58) Field of Classification Search
CPC ............ H01L 51/5293; H01L 51/5206; H01L 51/5221; H01L 51/5278; H01L 51/56;
(Continued)

(56) References Cited

U.S. PATENT DOCUMENTS

2004/0051445 A1* 3/2004 Adachi ............... H01L 51/5281
                                                                313/504
2015/0184068 A1   7/2015 Fuchter et al.
2016/0056389 A1   2/2016 Koch

FOREIGN PATENT DOCUMENTS

JP  2000195673 A  7/2000
JP  2003163087 A  6/2003
(Continued)

*Primary Examiner* — Tong-Ho Kim

(57) ABSTRACT

Provided is a display. A rotary polarized light emitting device includes: a first electrode; a second electrode; a light exiting layer, first light having a polarization state in which the first light rotates in a first direction, and exit, toward the second electrode, second light having a polarization state in which the second light rotates in a second direction that is opposite to the first direction.

12 Claims, 25 Drawing Sheets

(51) Int. Cl.
*H01L 51/00* (2006.01)
*H01L 27/32* (2006.01)
*H01L 51/50* (2006.01)

(52) U.S. Cl.
CPC .......... *H01L 51/5278* (2013.01); *H01L 51/56* (2013.01); *H01L 27/3244* (2013.01); *H01L 51/0039* (2013.01); *H01L 51/0043* (2013.01); *H01L 51/0072* (2013.01); *H01L 51/0073* (2013.01); *H01L 51/0078* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 2251/5307* (2013.01); *H01L 2251/5315* (2013.01)

(58) Field of Classification Search
CPC .............. H01L 51/0039; H01L 51/0043; H01L 51/0072; H01L 51/0073; H01L 51/0078; H01L 51/5012; H01L 51/5056; H01L 51/5072; H01L 51/5088; H01L 51/5092; H01L 2251/5307; H01L 2251/5315; H01L 27/3244
USPC .......................................................... 257/40
See application file for complete search history.

(56) References Cited

FOREIGN PATENT DOCUMENTS

| | | |
|---|---|---|
| JP | 2005216596 A | 8/2005 |
| JP | 2014103185 A | 6/2014 |
| KR | 20110134783 A | 12/2011 |
| KR | 20120016028 A | 2/2012 |
| KR | 20130131977 A | 12/2013 |
| KR | 20150001491 A | 1/2015 |
| KR | 101609278 B1 | 4/2016 |

* cited by examiner (a)

(b)

ROTARY POLARIZED LIGHT EMITTING BODY, ROTARY POLARIZED LIGHT EMITTING DEVICE, AND MANUFACTURING METHOD THEREFOR

CROSS-REFERENCE TO RELATED APPLICATIONS

This application is a continuation application of PCT application filed on May 23, 2018 and assigned Serial No. PCT/KR2018/005812, and which claims priority from Korean Patent Application No. 10-2017-0063675 filed with the Korean Intellectual Property Office on May 23, 2017, Korean Patent Application No. 10-2017-0076752 filed with the Korean Intellectual Property Office on Jun. 16, 2017, Korean Patent Application No. 10-10-2018-0056468 filed with the Korean Intellectual Property Office on May 17, 2018, The entire disclosures of above patent applications are incorporated herein by reference.

BACKGROUND

1. Field of the Invention

The present invention relates to a light emitting body, a rotary polarized light emitting body and a rotary polarized light emitting device of a display, and a method for manufacturing the same, and more particularly, to a light emitting body and a display which minimizes reflection by external light and maximizes optical efficiency.

2. Description of the Prior Art

A display, for example, an organic light emitting element is a display element that uses an electroluminescence of an organic material. The organic light emitting element generates light by energy generated when exitons generated by disposing an organic light emitting material between an anode electrode and a cathode electrode and coupling electrodes and holes of a light emitting layer by using currents flowing between the anode electrode and the cathode electrode drop from an excitation state to a base state.

According to the display, in order to prevent light input from the outside to the organic light emitting element from being reflected by the organic light emitting element and being discharged to the outside, as illustrated Korean Patent Application Publication No. 2013-075525, a phase difference film and a polarized plate are disposed on the organic light emitting element.

However, according to the conventional technology, a product cost problem may be caused due to an expensive phase difference film. Further, by the polarized plate, a portion of the light emitted from the organic light emitting layer may be blocked by the polarized plate, deteriorating visibility and light emission efficiency.

Accordingly, the inventors invented a display which maximizes the efficiency of light exited from the light emitting layer while minimizing reflection of external light.

SUMMARY

The present disclosure provides a rotary polarized light emitting body and a rotary polarized light emitting device which minimizes reflection of external light, and a method for manufacturing the same.

The present disclosure also provides a rotary polarized light emitting body and a rotary polarized light emitting device which has an excellent visibility by maximizing optical efficiency of providing light exiting from a light emitting layer to a viewer, and a method for manufacturing the same The present disclosure also provides a rotary polarized light emitting body and a rotary polarized light emitting device which provides a high rotary polarization ratio, and a method for manufacturing the same.

The technical problems that are to be solved by the present disclosure are not limited to the unmentioned technical problems.

According to an embodiment, a rotary polarized light emitting device may include: a first electrode disposed in a light exiting direction; a second electrode facing the first electrode; a light exiting layer disposed between the first electrode and the second electrode, configured to exit, toward the first electrode, first light having a polarization state in which the first light rotates in a first direction, and exit, toward the second electrode, second light having a polarization state in which the second light rotates in a second direction that is opposite to the first direction; and a polarizing layer disposed in the light exiting direction with respect to the first electrode, and configured to pass light that rotates in the first direction.

According to an embodiment, the second light may be reflected by the second electrode, and may have a polarization state in which the second light rotates in the first direction to pass through the polarizing layer, and external incident light may have a polarization state in which the external incident light rotates in the first direction as the external incident light passes through the polarizing layer, the external incident light having the polarization state in which the external incident light rotates in the first direction may be reflected by the second electrode to have a polarization state in which the external incident light rotates in the second direction such that the exit of the external incident light is blocked by the polarizing layer.

According to an embodiment, the first direction and the second direction may be directions that are defined with reference to a point of view of viewing the second location from the first location on a light travel path that faces from the first location to the second location.

According to an embodiment, the light exiting layer may include a chiral material that adjusts the layered distortion angles of the light emitting molecules of the light exiting layer such that the first light exiting from the light emitting layer has a polarization state in which the first light exiting from the light exiting layer rotates in the first direction toward the first electrode and the second light emitted from the light emitting layer has a polarization state in which the second light rotates in the second direction toward the second electrode.

According to an embodiment, the layered distortion angle may be 180 degrees or less.

According to an embodiment, a rotary polarized light emitting device may include: a first electrode; a second electrode facing the first electrode and located in a light exiting direction; a light exiting layer disposed between the first electrode and the second electrode, configured to exit, toward the second electrode, first light having a polarization state in which the first light rotates in a first direction, and exit, toward the first electrode, second light having a polarization state in which the second light rotates in a second direction that is opposite to the first direction; and a polarizing layer disposed in the light exiting direction with respect to the second electrode, and configured to pass light that rotates in the first direction.

According to an embodiment, the second light may be reflected by the first electrode, and may have a polarization state in which the second light rotates in the first direction to pass through the polarizing layer, and external incident light may have a polarization state in which the external incident light rotates in the first direction as the external incident light passes through the polarizing layer, the external incident light having the polarization state in which the external incident light rotates in the first direction may be reflected by the first electrode to have a polarization state in which the external incident light rotates in the second direction such that the exit of the external incident light is blocked by the polarizing layer.

According to an embodiment, the first direction and the second direction may be directions that are defined with reference to a point of view of viewing the second location from the first location on a light travel path that faces from the first location to the second location.

According to an embodiment, the light exiting layer may include a chiral material that adjusts the layered distortion angles of the light emitting molecules of the light exiting layer such that the first light exiting from the light emitting layer has a polarization state in which the first light emitting from the light exiting layer rotates in the first direction toward the second electrode and the second light emitted from the light emitting layer has a polarization state in which the second light rotates in the second direction toward the first electrode.

According to an embodiment, the layered distortion angle may be 180 degrees or less.

According to an embodiment, a rotary polarized light emitting device may include: a first electrode; a second electrode facing the first electrode; a polarizing layer, through which left or right light disposed outside the first electrode or the second electrode selectively passes; a light exiting layer disposed between the first electrode and the second electrode and including a chiral material, the chiral material may be left or right-polarized such that the light generated by the light exiting layer passes through the polarizing layer, and the intensity of the light generated by the light exiting layer measured on the outer side of the polarizing layer in the light exiting layer including the chiral material may be stronger than that in the light exiting layer that does not include the chiral material.

According to an embodiment, the light exiting layer may include light emitting molecules, and the light emitting molecules may be aligned in a specific direction to exit a linearly polarized light.

According to an embodiment, a rotary polarized light emitting body may include: non-chiral light emitting molecules; and a dopant configured to provide a distortion angle in the thickness direction of the light emitting molecules, and configured to laminate the light emitting molecules in a spiral structure.

According to an embodiment, the dopant may provide helical twisting power to the light emitting molecules such that the light emitting molecules rotate at the distortion angle.

According to an embodiment, a method for manufacturing a rotary polarized light emitting device may include: forming a first electrode; forming a light exiting layer including a light emitting layer including light emitting molecules and a chiral dopant on the first electrode; and forming a second electrode on the light exiting layer, and in the forming of the light exiting layer, a g-factor of the light emitting from the light emitting layer may be controlled by adjusting, by the chiral dopant, a layered distortion angle of the light emitting molecules.

According to an embodiment, the forming of the light exiting layer may include: performing at least one of control of the layered distortion angle, control of the index of refractivity of the light exiting layer, and control of a light emitting zone of the light emitting layer, and the light emitting zone of the light emitting layer may be defined with reference to a distance from at least one of the first and second electrodes.

According to an embodiment, the layered distortion may be controlled to 180 degrees or less.

According to an embodiment, when the first electrode is a transparent electrode and the second electrode is a reflective electrode, the light emitting zone of the light emitting layer may be controlled to be close to the second electrode.

According to an embodiment, the light emitting zone of the light emitting layer may be controlled to be closer to the second electrode within 20% of the thickness of the light emitting layer.

According to an embodiment, the index of refractivity of the light exiting layer may be controlled according to the location of the light emitting zone of the light emitting layer.

According to an embodiment, a rotary polarized light emitting device may include: a first electrode disposed in a light exiting direction; a second electrode facing the first electrode; a light exiting layer disposed between the first electrode and the second electrode, configured to exit, toward the first electrode, first light having a polarization state in which the first light rotates in a first direction, and exit, toward the second electrode, second light having a polarization state in which the second light rotates in a second direction that is opposite to the first direction; and a polarizing layer disposed in the light exiting direction with respect to the first electrode, and configured to pass light that rotates in the first direction.

Accordingly, the second light may be reflected by the second electrode, and may have a polarization state in which the second light rotates in the first direction to pass through the polarizing layer, and external incident light may have a polarization state in which the external incident light rotates in the first direction as the external incident light passes through the polarizing layer, the external incident light having the polarization state in which the external incident light rotates in the first direction may be reflected by the second electrode to have a polarization state in which the external incident light rotates in the second direction such that the exit of the external incident light is blocked by the polarizing layer. Accordingly, the display according to the embodiment of the present disclosure can maximize optical efficiency while minimizing reflection by external light.

According to a rotary polarized light emitting device and a method for manufacturing the same according to an embodiment of the present disclosure, a high rotary polarization ration can be provided.

According to a rotary polarized light emitting device and a method for manufacturing the same according to an embodiment of the present disclosure, reflection of external light can be minimized.

According to a rotary polarized light emitting device and a method for manufacturing the same according to an embodiment of the present disclosure, an excellent visibility can be achieved by maximizing optical efficiency of providing light exiting from a light emitting layer to a viewer.

The effects of the present disclosure are not limited by the above-described effects of the present disclosure.

BRIEF DESCRIPTION OF THE DRAWINGS

The above and other objects, features, and advantages of the present invention will be more apparent from the following detailed description taken in conjunction with the accompanying drawings, in which.

DETAILED DESCRIPTION OF THE EXEMPLARY EMBODIMENTS

Figure 1:
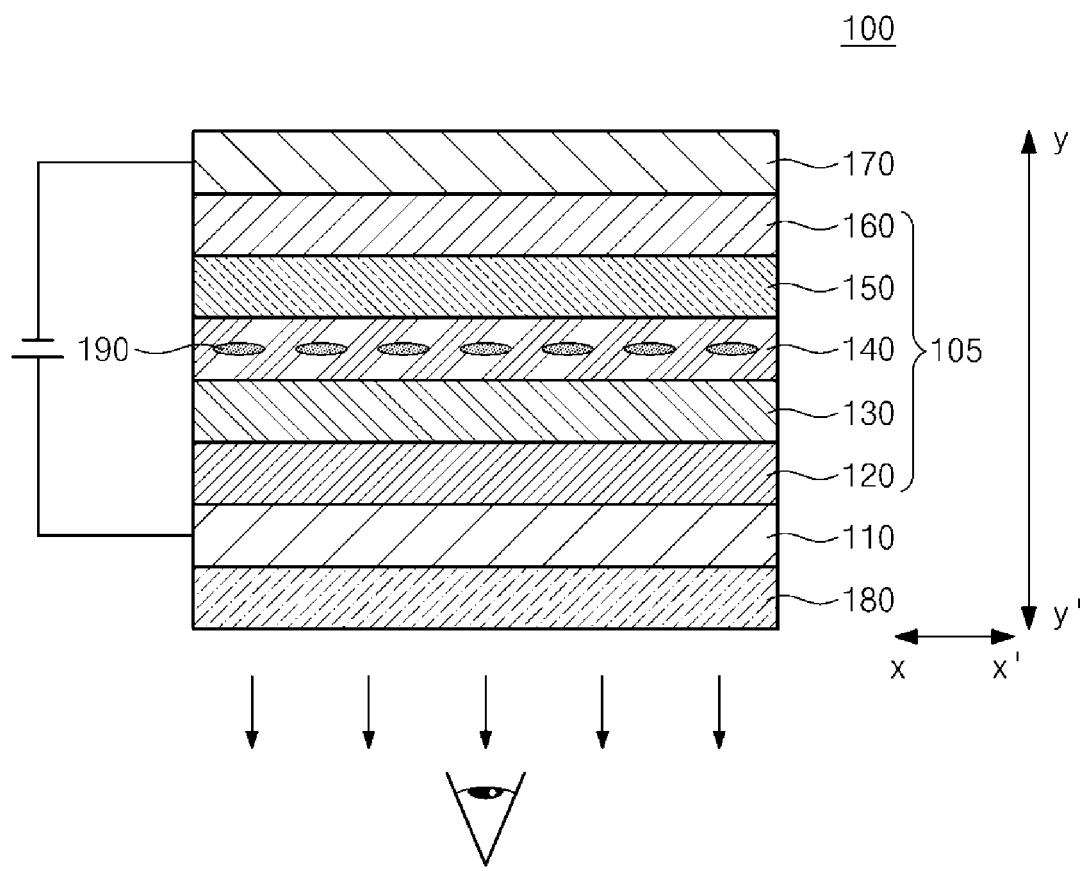
FIG. 1 illustrates a partially cross-sectional view illustrating a display according to a first embodiment of the present disclosure.

Hereinafter, preferred embodiments of the present disclosure will be described in detail with reference to the accompanying drawings. However, the technical spirit of the present disclosure is not limited to the embodiments, but may be realized in different forms. The embodiments introduced here are provided to sufficiently deliver the spirit of the present disclosure to those skilled in the art so that the disclosed contents may become thorough and complete.

When it is mentioned in the specification that one element is on another element, it means that the first element may be directly formed on the second element or a third element may be interposed between the first element and the second element. Further, in the drawings, the thicknesses of the films and the areas are exaggerated for efficient description of the technical contents.

Further, in the various embodiments of the present disclosure, the terms such as first, second, and third are used to describe various elements, but the elements are not limited to the terms. The terms are used only to distinguish one element from another element. Accordingly, an element mentioned as a first element in one embodiment may be mentioned as a second element in another embodiment. The embodiments illustrated here include their complementary embodiments. Further, the term "and/or" in the specification is used to include at least one of the elements enumerated in the specification.

In the specification, the terms of a singular form may include plural forms unless otherwise specified. Further, the terms "including" and "having" are used to designate that the features, the numbers, the steps, the elements, or combination thereof described in the specification are present, and may be understood that one or more other features, numbers, step, elements, or combinations thereof may be added. Further, in the specification, "connected to" is used to mean a plurality of elements are indirectly or directly connected to each other.

In the specification, the display may refer to a rotary polarized light emitting device.

Further, in the following description of the present disclosure, a detailed description of known functions and configurations incorporated herein will be omitted when it may make the subject matter of the present disclosure rather unclear.

FIG. 1 illustrates a partially cross-sectional view illustrating a display according to a first embodiment of the present disclosure. A display according to the first embodiment of the present disclosure is applied to a bottom emission display device, and a display according to the second embodiment of the present disclosure, which will be described below, may be applied to a top emission display device.

Referring to FIG. 1, the display 100 according to the first embodiment of the present disclosure may include a first electrode 110, a second electrode 170, a light exiting layer 105, and a polarizing layer 180. Then, the elements may be laminated in the sequence of the polarizing layer 180, the first electrode 110, the light exiting layer 100, and the second electrode 170 in a direction from y' to y, and the light exiting from the light exiting layer 105 may be provided for a viewer in the direction of y' to implement a bottom emission type display. Hereinafter, the elements will be described in detail.

The first electrode 110 may be an anode electrode that provides holes to the light exiting layer 105. The first electrode 110 may include a transparent electrode such that light passes through the first electrode 110.

It is apparent that if the work function of the first electrode 110 is smaller than that work function of the second electrode 170, the first electrode 110 may correspond to the cathode electrode. Hereinafter, for convenience of description, it is assumed that the first electrode 110 is an anode electrode.

The first electrode 110 may be a sharing electrode that may be shared by adjacent pixels, and may be divided to be formed for respective pixels. Hereinafter, for convenience of description, it is assumed that the first electrode 110 is a division electrode. In this case, the first electrode 110 may be individually controlled for respective pixels.

Although not illustrated, it is apparent that another configuration may be provided between the first electrode 110 and the polarizing layer 180. For example, a substrate, active elements formed on the substrate, and the like may be provided between the first electrode 110 and the polarizing layer 180. Then, the substrate may be formed of at least one material, among polyethylene terephthalate (PET), polyethylenenaphthalate (PEN), and polyimide (PI), as well as a glass substrate.

The light exiting layer 105 may refer to a layer that generates and exits light. For example, the light exiting layer 105 may be formed of a material for generating and exiting light, and may be formed of one of organic molecules or quantum inorganic molecules. Hereinafter, for convenience of description, it is assumed that the light exiting layer 105 is an organic light emitting layer.

The light exiting layer 105 may be a layer in which a hole injection layer 120, a hole transporting layer 130, a light emitting layer 140, an electronic injection layer 150, and an electron transporting layer 160 are laminated in the sequence thereof in a direction from y' to y. However, it is apparent that the light exiting layer 105 may include a smaller or larger number of layers.

The light exiting layer 105 is disposed between the first electrode 110 and the second electrode 170, and may exit, toward the first electrode 110, first light having a polarization state in which the first light rotates in a first direction, and exit, toward the second electrode 170, second light having a polarization state in which the second light rotates in a second direction that is opposite to the first direction.

Then, the first direction and the second direction may be directions that are defined with reference to a point of view of viewing the second location from the first location on a light travel path that faces from the first location to the second location.

Further, the polarization state of rotation in the first direction or the second direction may be understood as a concept including rotary polarization or elliptical polarization. The rotary polarization may refer to a case in which a vector sum of the x axis magnetic field and the y axis magnetic field light that travels in the z axis direction continue to change circularly on an incident plane, that is, a case in which the amplitudes of the two components of the x axis magnetic field and the y axis magnetic field are exactly the same and the phase difference thereof is 90°. Further, the elliptical polarization may be defined as all the cases other than linear polarization and rotary polarization, that is, the polarization state draws an ellipse when the magnitude of the synthetized magnetic field vector changes while the synthetized magnetic field vector rotates.

Hereinafter, for convenience of description, light that rotates counterclockwise when viewed from the first location to the second location when the light faces from the first location to the second location will be defined as light having a polarization state in which the light rotates in the first direction, and light that rotates clockwise will be defined as light having a polarization state in which the light rotates in the second direction.

The hole injection layer (HLT) 120 is formed on the first electrode 110, and may perform a function of smoothly injecting holes. To achieve this, the hole injection layer 120 may include at least one material, among 4,4',4"-tris(3-methylphenylphenylamino)triphenylamine (MTDATA), copper phthalocyanine (CuPc), poly(3,4-ethylenedioxythiphene, polystyrene sulfonate) (PEDOT/PSS), and N,N-dinaphthyl-N,N-diphenylbenzidine (NPD), but the present disclosure is not limited thereto.

The hole transporting layer (HTL) 130 is formed on the hole injection layer 120, and may perform a function of smoothly transporting holes. To achieve this, the hole transporting layer 130, for example, may include at least one material, among N,N-dinaphthyl-N,N-diphenylbenzidine), TPD(N,N-bis-(3-methylphenyl)-N,N-bis-(phenyl)-benzidine) (NPD), s-TAD, and 4,4',4"-Tris(N-3-methylphenyl-N-phenyl-amino)-triphenylamine) (MTDATA), but the present disclosure is not limited thereto.

The hole injection layer 120 and the hole transporting layer 130 may be formed by using various methods, such as vacuum deposition, spin coating, casting, Langmuir-Blodgett (LB), ink-jet printing, laser printing, and laser induced thermal imaging (LITI).

In the light emitting layer 140, the holes supplied through the hole transporting layer 130 and the electrons supplied through the electron transporting layer 150 may be recoupled to each other, generating light.

The light emitting layer 140 may include light emitting molecules. The light emitting molecules, for example, may have an achiral shape. In another aspect, the light emitting molecules of the achiral shape may have a rod shape. In another aspect, the light emitting molecules may be a conjugated polymer. In another aspect, the light emitting molecules may be an achiral polymer.

Hereinafter, the light emitting molecules may be called organic molecules or organic light emitting molecules.

The light emitting molecules may be classified according to molecular weights thereof. For example, the light emitting molecules also may be low-molecular light emitting molecules or high-molecular light emitting molecules. In detail, the high-molecular light emitting molecules may include at least one material of poly(9,9-dioctylfluorene-co-benzothiadiazole; F8BT), poly(9,9-dioctyl-2,7-fluorene;PFO), and the low-molecular light emitting molecules may include at least one material of KSW-1-14 and KSW-1-20.

The light emitting molecules of the light emitting layer 140 may be defined by the wavelength exited by the light emitting layer 140. When the light emitting layer 140 generates red light, the light emitting layer 140, for example, may include a host material including CBP (carbazole biphenyl) or mCP (1,3-bis(carbazol-9-[0058] yl), and may include a phosphorescent material including at least one dopant of PIQIr(acac)(bis(1-phenylisoquinoline) acetylacetonate iridium), PQIr(acac)(bis(1-phenylquinoline) acetylacetonate iridium), PQIr(tris(1-phenylquinoline) iridium), and PtOEP(octaethylporphyrin platinum), and unlike this, may include a fluorescent material including PBD:Eu (DBM)3(Phen) or Perylene. If the light emitting layer 140 generates green light, the light emitting layer 140 may include at least one phosphorescent material of TCTA (Tris (4-carbazoyl-9-ylphenyl)amine), CBP (4,4'-Bis(Ncarbazolyl)-1,1'-biphenyl), Balq (Bis(8-hydroxy-2-methylquinoline)-(4-phenylphenoxy)aluminum), and PPV(poly(p phenylene vinylene)) as a host material. Further, when the light emitting layer 140 generates blue light, the light emitting layer 140 may include a host material including CBP or mCP, and may include a phosphorescent material including a dopant material including (4,6-F2ppy)2Irpic. Unlike this, the light emitting layer 140 may include at least one fluorescent material of spiro-DPVBi, spiro-6P, DSB, DSA, a PFO-based polymer, and a PPV-based polymer.

The light emitting layer 140 may include a chiral material 190, for example, a chiral dopant such that the light exiting from the light emitting layer 140 has a polarization state in which light rotates in a specific direction. The chiral material 190 may influence the orientation directions of the surrounding light emitting organic molecules. The chiral dopant 190 may provide a distortion angle in the thickness direction of the light emitting molecules to laminate the light emitting molecules in a spiral structure. Accordingly, the polarization state in which the light generated in the light emitting molecules rotates may be achieved. For a more detailed description thereof, FIGS. 2A and 2B will be referenced.

Figure 2A:
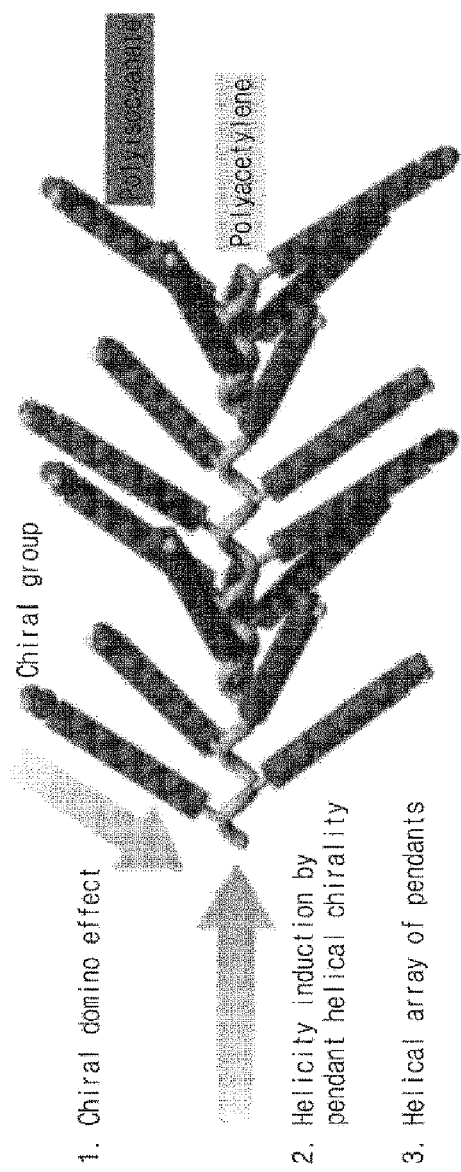
FIGS. 2A and 2B are a view illustrating a spiral lamination structure of light emitting molecules according to an embodiment of the present disclosure.
Figure 2B:
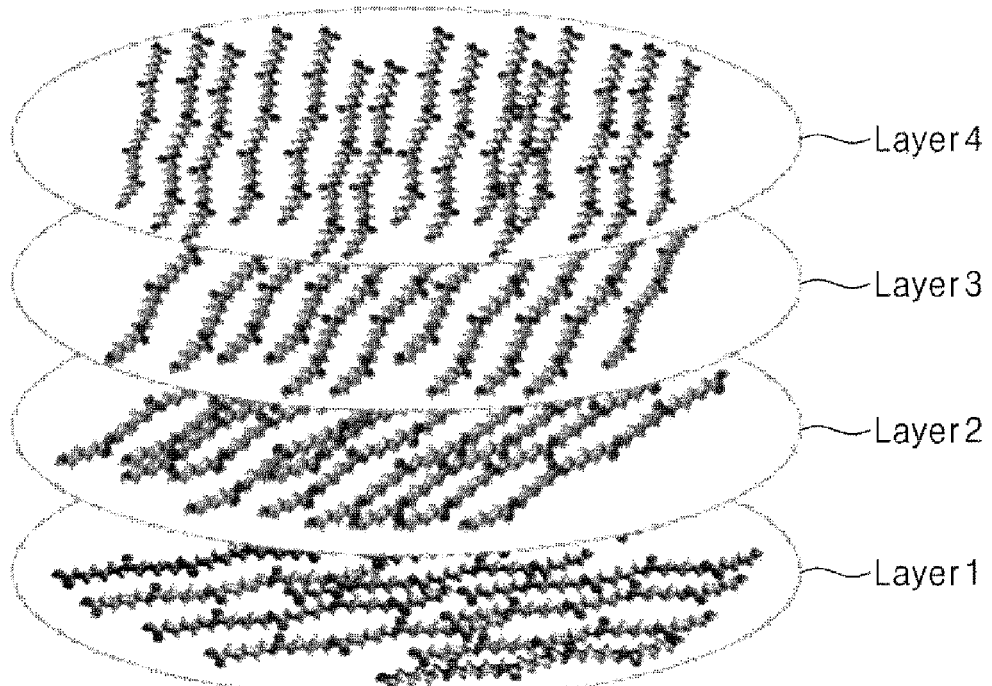

FIGS. 2A and 2B are a view illustrating a spiral lamination structure of light emitting molecules according to an embodiment of the present disclosure. In detail, FIG. 2A illustrates a structure for realizing a rotary polarization state according to the related art, and FIG. 2B illustrates a structure for realizing a rotary polarization state according to an embodiment of the present disclosure.

Referring to FIG. 2A, the light emitting molecules themselves may have a spiral structure. In this case, because the light emitting molecules themselves have a spiral structure, the light generated in the light emitting molecules may have a rotary polarization state. Further, a spiral dopant, for example, 1-aza(6)heliscene may be attached to the light emitting molecules. In this case, the light generated in the light emitting molecules by a spiral dopant may have a rotary polarization state.

However, in the case illustrated in FIG. 2A, there is a difficulty in which the wavelength, that is, the color of the light generated as the dopant is synthesized changes. Further, the capability of giving, to the generated light, a rotary polarization state depends on the structure of the light emitting molecules themselves or the structure of the dopant itself, there is a limit in the capability of generating rotary polarized light.

Unlike this, referring to FIG. 2B, the chiral dopant may provide a distortion angle to the light emitting molecules. When the light emitting molecules are laminated on layer 1 to layer 4 in the thickness direction of the light emitting molecules, the chiral dopant may rotate the light emitting molecules of layer 2 by θ1, the light emitting molecules of layer 3 by θ2, and the light emitting molecules of layer 4 by θ3. To achieve this, the helical twisting power (HTP) of the chiral dopant for providing the distortion angle to the light emitting molecules may be 10/µm or more, and preferably, 100/µm. According to an embodiment, the chiral dopant may have a non-spiral shape. Further, the chiral dopant may include R5011. That is, the chiral dopant may provide the distortion stacking shapes of the light emitting molecules at a macroscopic level.

According to an embodiment, when heat annealing, for example, heat annealing to 140 degrees or more is performed in the state in which the light emitting molecules and the chiral dopant are mixed and the mixture is cooled at room temperature, as illustrated in FIG. 2B, the light emitting molecules may have a spiral lamination structure. That is, when a phase is transited to a mesophase and then cooling is performed through heat annealing, the light emitting molecules may have a spiral lamination structure.

Because the light emitting molecules may have a spiral lamination structure due to the chiral material, the light generated in the light emitting molecules may have a rotary polarization state. The light emitting layer 140 including the spirally laminated light emitting molecules may exit first light having a polarization state in which the first light rotates in a first direction toward the first electrode 110, and may exit second light having a polarization state in which the second light rotates in a second direction, which is opposite to the first direction, toward the second electrode 170.

Then, unlike the conventional technology, according to an embodiment of the present disclosure, the rotary polarization characteristics given to the generated light can be maximized such that the light emitting molecules have a spiral shape in the lamination direction of the light emitting molecules.

Referring back to FIG. 1, the light emitting layer 140 may be formed by using various methods, such as vacuum deposition, spin coating, casting, Langmuir-Blodgett (LB), ink-jet printing, laser printing, and laser induced thermal imaging (LITI).

The electron transporting layer (ETL) 150 may be formed in the light emitting layer 140, and may transport electrons to the light exiting layer 105. To achieve this, the electron transporting layer 150, for example, may include at least one material of Alq3, PBD, TAZ, Spiro-PBD, BAlq, Liq (lithium quinolate), BMB-3T, PF-6P, TPBI, COT, and SAlq, but the present disclosure is not limited thereto.

The electron injection layer (EIL) 160 may be formed on the electron transporting layer 150, and may inject electrons to the electron transporting layer 150. To achieve this, the electron injection layer 160 may include at least one material of Alq3(tris(8-hydroxyquinolino)aluminum), PBD, TAZ, Spiro-PBD, BAlq, and SAlq.

The electron transporting layer 150 and the electron injection layer 160 may be formed by using various methods, such as vacuum deposition, spin coating, casting, Langmuir-Blodgett, ink-jet printing, laser printing, and laser induced thermal imaging (LITI).

The second electrode 170 may be formed on the electron injection layer 160, and may provide electrons to the electron injection layer 160. The second electrode 170 may have a high conductivity, and may have a reflectivity such that the light exiting to the second electrode 170 may be reflected in the y' direction. The second electrode 170, for example, may include at least one material of gold (Au), silver (Ag), aluminum (Al), molybdenum (Mo), and magnesium (Mg), but the present disclosure is not limited thereto.

According to an embodiment, the second electrode 170 may include a sharing electrode shared by sub-pixels.

A capping layer (not illustrated) may be formed on the second electrode 170. The capping layer functions to improve a light extraction effect. The capping layer may include an organic material that has a hole transporting capability, and may include a host material that constitutes the light emitting layer. However, the capping layer may be omitted.

Meanwhile, although not illustrated on the second electrode 170, an encapsulation layer for preventing moisture penetration may be formed.

According to an embodiment, the polarizing layer 180 may be located in a light exiting direction, that is, the y' direction with respect to the first electrode 110. The polarizing layer may include a circular polarizing layer and a linear polarizing layer located in the y' direction with respect to the circular polarizing layer. The polarizing layer 180 may optionally transmit light corresponding to the polarization state of the circular polarizing layer. Then, the circular polarizing layer of the polarizing layer 180 may optionally transmit light having a polarization state in which the light rotates in the first direction. That is, the polarizing layer 180 may block the light having a polarization state in which the light rotates in the second direction such that the light cannot pass through the polarizing layer 180. A detailed function of the polarizing layer 180 will be described below with reference to FIGS. 2A and 2B. The circular polarizing layer of the polarizing layer may be understood as a concept including an elliptical polarizing layer.

Meanwhile, the display 100 according to the first embodiment of the present disclosure can be manufactured through the following processes. First, a substrate (not illustrated) may be provided. A driving layer including at least one transistor that controls pixels through a photolithographic process and at least one capacitor may be formed on the substrate. A first electrode 110 may be formed on the driving layer through a photolithographic process or a liquid phase process. A light exiting layer 105 may be formed on the first electrode 110. Then, the light exiting layer 105 may be coated through a solution process, that is, a soluble process when organic molecules are high molecules. Unlike this, when the organic molecules are low molecules, they may be deposited through a vapor deposition process. The chiral material may be formed together with the light exiting layer 105, for example, the light emitting layer 140. A second electrode 170 may be formed on the light exiting layer 105. An encapsulation layer that prevents penetration of moisture and air, for example, an organic-inorganic complex barrier layer may be formed on the second electrode 170.

Until now, the display according to the first embodiment of the present disclosure has been described with reference to FIG. 1. Hereinafter, an operation example of the display according to the first embodiment of the present disclosure will be described.

Figure 3:
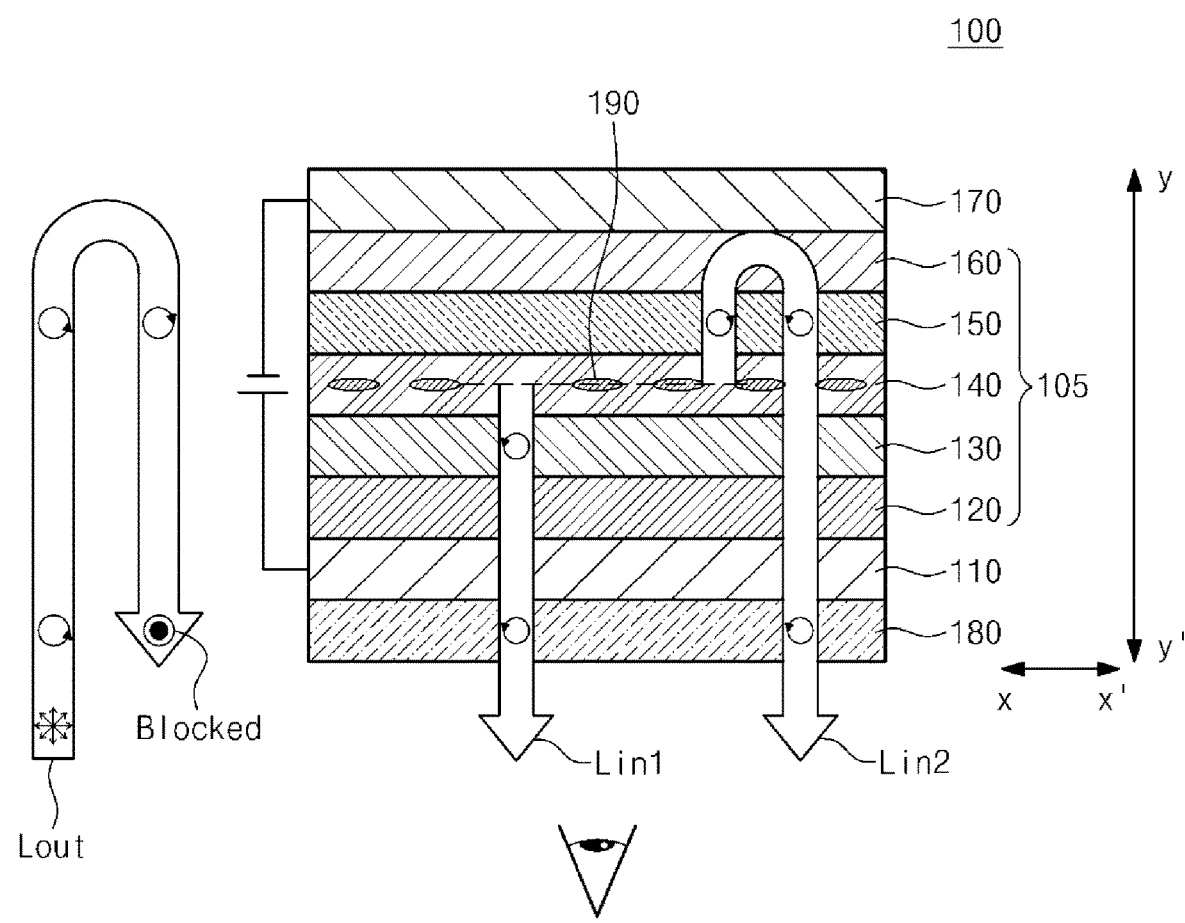
FIG. 3 is a view illustrating an operation example of the display according to the first embodiment of the present disclosure.

FIG. 3 is a view illustrating an operation example of the display according to the first embodiment of the present disclosure.

An example of preventing reflection of external light by the display and an example of maximizing optical efficiency according to the first embodiment of the present disclosure will be described with reference to FIG. 3.

The display 100 may block external light Lout such that the external light Lout does not deviate to the outside of the polarizing layer 180 when the external light Lout travels again from y to y' after being input from y' to y. Accordingly, the display according to the first embodiment of the present disclosure can provide an external light blocking effect. Hereinafter, this will be described in detail.

Subsequently, referring to FIG. 3, first, an environment in which the external light Lout may enter the interior of the display 100 may be created. Then, the external light Lout may have a non-polarized state before entering the display 100. However, because the polarizing layer 180 optionally transmits the light that rotates in the first direction, that is, counterclockwise with respect to the travel direction of the light, a polarization state in which the external light Lout rotates in the first direction that is a counterclockwise direction when viewed from y' with respect to the light travel direction (from y' to y) after the external light Lout passes through the polarizing layer 180 of the display 100.

The external light Lout having a polarization state in which the external light Lout rotates in the first direction that is the counterclockwise direction may travel from the y' direction to the y direction. Accordingly, the external light Lout having the polarization state in which the external light Lout rotates in the first direction may pass through the light exiting layer 105, and may be reflected by the second electrode 170. Accordingly, the travel direction of the external light Lout may be changed from the y' to y direction to the y to y' direction. The rotational direction of the polarization state of the external light Lout may be changed by reflection. That is, the polarization direction of the external light Lout may be changed from the first direction that is the counterclockwise direction with respect to the travel direction (from y' to y) to the second direction that is the clockwise direction with respect to the travel direction (from y to y'). The external light Lout having the polarization state in which the external light Lout rotates in the second direction by the reflection of the second electrode 170 may pass through the light exiting layer 105, and may reach the polarizing layer 180. However, the external light Lout having the polarization state in which the external light Lout rotates in the second direction cannot pass through the polarizing layer 180 that optionally transmits the light that rotates in the first direction. Accordingly, even when the external light Lout is irradiated to the interior of the display 100, the external light Lout that entered into the display 100 can be prevented from being viewed by a viewer.

Until now, the effect of preventing reflection of the external light by the display according to the first embodiment of the present disclosure has been described. Hereinafter, an example of maximizing optical efficiency will be described.

The light generated in the light emitting layer 140 may be classified into first light Lin1 that travels toward the first electrode 100 and second light Lin2 that travels toward the second electrode 170. Then, the light generated in the light emitting layer 140 may have a rotary polarization state by the light emitting molecules laminated in the spiral shape by the chiral material 190.

In detail, the first light Lin1 may have a polarization state in which the first light Lin1 rotates in the first direction that is the counterclockwise direction with respect to the chiral light travel direction (from y to y'). The first light Lin1 having a polarization state in which the first light Lin1 rotates in the first direction may pass through the polarizing layer 180. Accordingly, the first light Lin1 may be delivered to the viewer.

The second light Lin2 may have a polarization state in which the second light Lin2 rotates in the second direction that is the clockwise direction with respect to the chiral light travel direction (from y' to y). The second light Lin2 having a polarization state in which the second light Lin2 rotates in the second direction may be reflected by the second electrode 170. The second light Lin2 reflected by the second electrode 170 may have a polarization state in which the second light Lin2 rotates in the first direction that is the counterclockwise direction with respect to the light travel direction (from y to y'). The second light Lin2 having a polarization state in which the second light Lin2 rotates in the first direction may pass through the polarizing layer 180. Accordingly, the second light Lin2 may be delivered to the viewer.

In summary, the light generated in the light emitting layer 140 may have a light travel path along which the light travels in a random direction. The light generated in the light emitting layer 140 may have a random path and may be largely classified into first light Lin1 that travels toward the first electrode 100 and second light Lin2 that travels toward the second electrode 170. Then, the first light Lin1 may pass through the polarizing layer 180 because it has a polarization state in which the first light Lin1 rotates in the first direction, and the second light Lin2 may have a polarization state in which the second light Lin2 rotates in the first direction because the second light Lin2 initially has a polarization state in which the second light Lin2 rotates in the second direction but is reflected by the second electrode 170. Accordingly, the second light as well as the first light may pass through the polarizing layer 180. Accordingly, the optical efficiency of delivery to the viewer can be maximized.

Until now, the operation example of the display according to the first embodiment of the present disclosure has been described with reference to FIG. 3. Hereinafter, first to third modifications of the first embodiment of the present disclosure will be described with reference to FIGS. 4 to 6. In a description of the modifications of the first embodiment of the present disclosure with reference to FIGS. 4 to 6, a description of the same configurations as those of the first embodiment described with reference to FIGS. 1 to 3 will be omitted.

Figure 4:
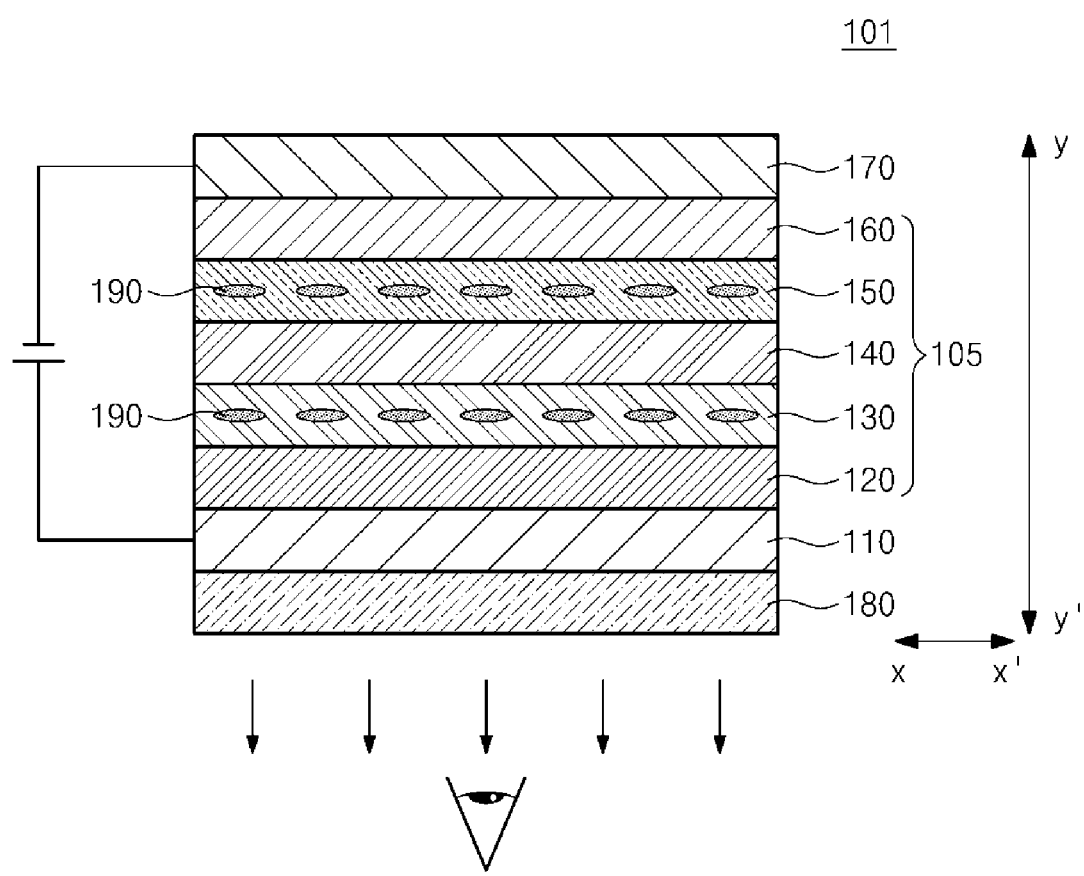
FIG. 4 is a view illustrating a first modification of the display according to the first embodiment of the present disclosure.

FIG. 4 is a view illustrating a first modification of the display according to the first embodiment of the present disclosure.

Referring to FIG. 4, according to the first modification of the present disclosure, the chiral material 190 may be included in at least one layer of the hole transporting layer 130 and the electron transporting layer 150. In this case, the chiral material 190 may laminate the molecules constituting the hole transporting layer 130 and/or the molecules constituting the electron transporting layer 150 in a spiral structure in the thickness direction of the molecules.

In this case, among the light generated in the light emitting layer 140, the first light Lin 1 that faces the first electrode 110 may have a chiral rotary polarization state by the hole transporting layer 130 in which the molecules have a spiral lamination structure. That is, because the first light Lin1 has a polarization state in which the first light Lin1 rotates in the first direction, it may pass through the polarizing layer 180.

Further, among the light generated in the light emitting layer 140, the second light Lin2 that faces the second electrode 170 may have a chiral rotary polarization state by the electron transporting layer 150 in which the molecules have a spiral lamination structure. That is, the second light Lin2 has a polarization state in which the second light Lin2 rotates in the second direction, and may have a polarization state in which the second light Lin2 rotates in the first direction because the second light Lin2 is reflected by the second electrode 170 as described above. Accordingly, the second light Lin2 may pass through the polarizing layer 180.

It has been described that the chiral material 190 is included in the hole transporting layer 130 and the electron transporting layer 150 according to the first modification of the present disclosure with reference to FIG. 4, it is apparent that the chiral material 190 is included in the light emitting layer 140 as well as the hole transporting layer 130 and the electron transporting layer 150.

Figure 5:
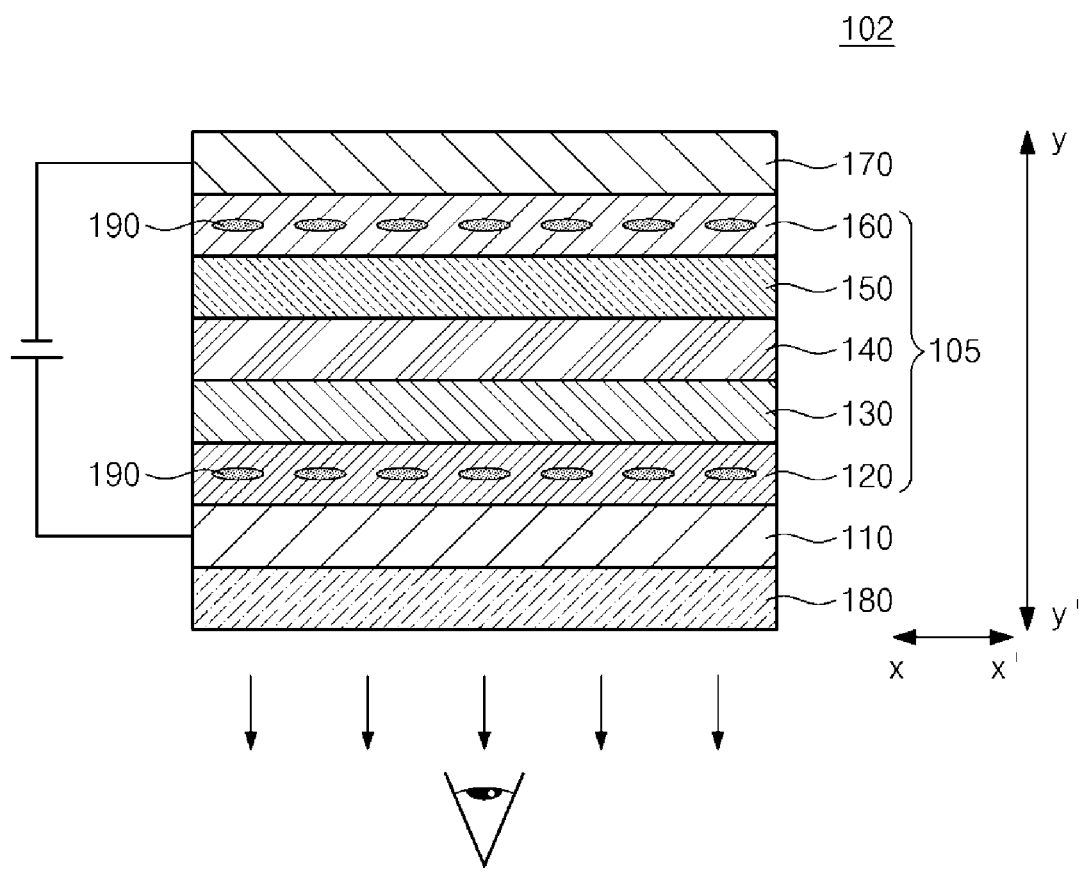
FIG. 5 is a view illustrating a second modification of the display according to the first embodiment of the present disclosure.

FIG. 5 is a view illustrating a second modification of the display according to the first embodiment of the present disclosure.

Referring to FIG. 5, according to the second modification of the present disclosure, the chiral material 190 may be included in at least one layer of the hole injection layer 120 and the electron injection layer 160. In this case, the chiral material 190 may laminate the molecules constituting the hole injection layer 120 and/or the molecules constituting the electron injection layer 160 in a spiral structure in the thickness direction of the molecules.

In this case, among the light generated in the light emitting layer 140, the first light Lin 1 that faces the first electrode 110 may have a chiral rotary polarization state by the hole injection layer 120 in which the molecules have a spiral lamination structure. That is, because the first light Lin1 has a polarization state in which the first light Lin1 rotates in the first direction, it may pass through the polarizing layer 180.

Further, among the light generated in the light emitting layer 140, the second light Lin2 that faces the second electrode 170 may have a chiral rotary polarization state by the electron injection layer 160 in which the molecules have a spiral lamination structure. That is, the second light Lin2 has a polarization state in which the second light Lin2 rotates in the second direction, and may have a polarization state in which the second light Lin2 rotates in the first direction because the second light Lin2 is reflected by the second electrode 170 as described above. Accordingly, the second light Lin2 may pass through the polarizing layer 180.

It has been described that the chiral material 190 is included in the hole injection layer 120 and the electron injection layer 160 according to the second modification of the present disclosure with reference to FIG. 5, it is apparent that the chiral material 190 is included in at least one of the light emitting layer 140, the hole transporting layer 130 and the electron transporting layer 150.

Figure 6:
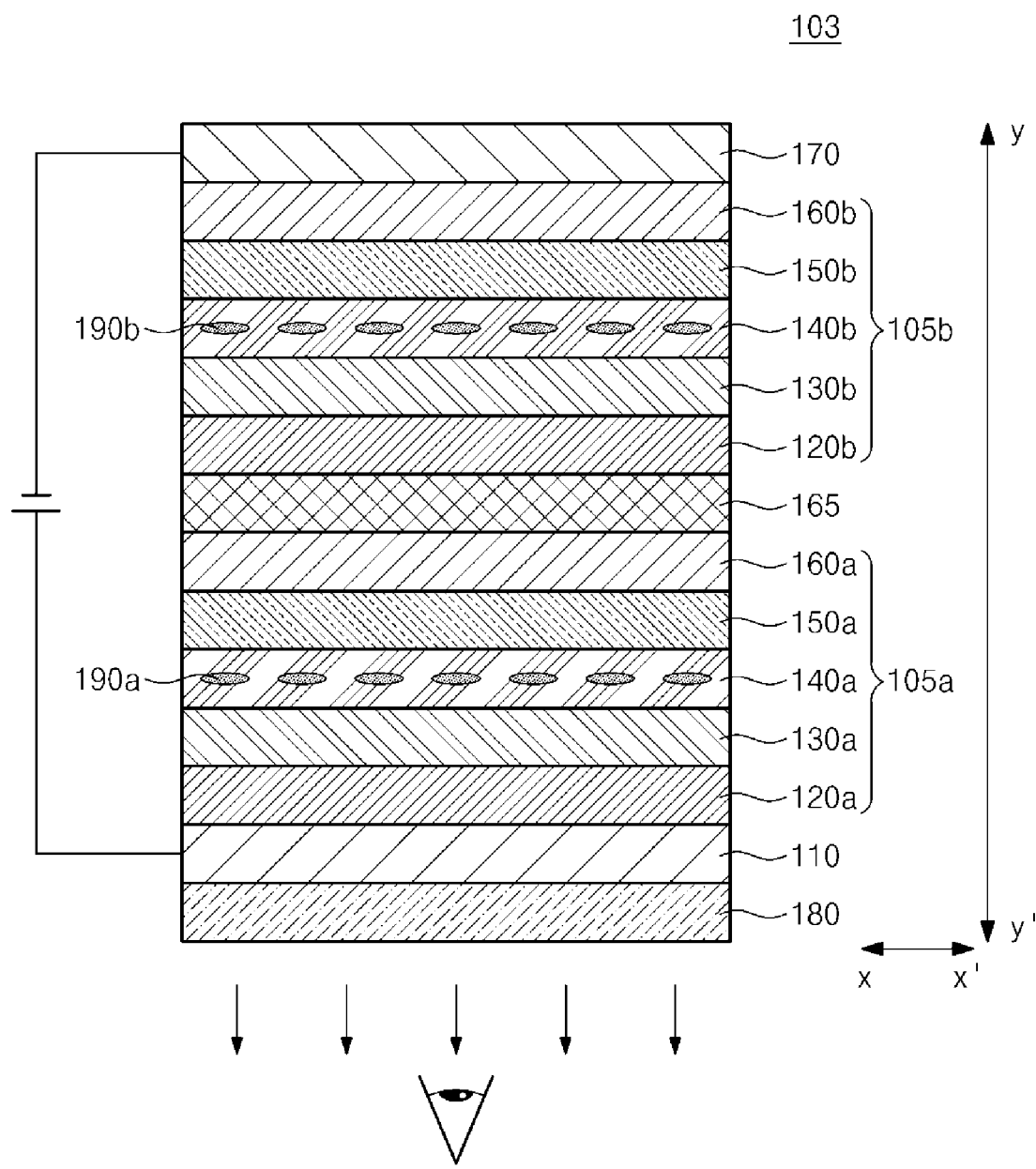
FIG. 6 is a view illustrating a third modification of the display according to the first embodiment of the present disclosure.

FIG. 6 is a view illustrating a third modification of the display according to the first embodiment of the present disclosure.

Referring to FIG. 6, an example of the technical spirit of the present disclosure is applied to a tandem structure is illustrated as the display 103 according to the third modification of the first embodiment of the present disclosure. The tandem structure may refer to a structure in which two or more light exiting layers are connected to each other in series. Then, the charge generation layer may provide an interface of an individual light exiting layer. Hereinafter, this will be described in detail.

Referring to FIG. 6, the display 103 according to the third modification of the first embodiment of the present disclosure may have a structure in which the first electrode 110, a first light exiting layer 105*a*, a charge generation layer 165, a second light exiting layer 105*b*, and second electrode 170 are staked in the sequence thereof in the y direction with respect to the polarizing layer 180. Then, the first light exiting layer 105*a* may include a first hole injection layer 120*a*, a first hole transporting layer 130*a*, a first light emitting layer 140*a*, a first electron transporting layer 150*a*, and a first electron injection layer 160*a*. Further, the second light exiting layer 105*b* may include a second hole injection layer 120*b*, a second hole transporting layer 130*b*, a second light emitting layer 140*b*, a second electron transporting layer 150*b*, and a second electron injection layer 160*b*.

The polarizing layer 180, the first electrode 110, and the second electrode 170 are the same as those described with reference to FIGS. 1 and 2, and a detailed description thereof will be omitted.

The first hole injection layer 120*a* and the second hole injection layer 120*b* may perform a function of smoothly injecting holes. To achieve this, for example, they may include at least one material, among 4,4',4"-tris(3-methylphenylphenylamino)triphenylamine (MTDATA), copper phthalocyanine (CuPc), poly(3,4-ethylenedioxythiophene, polystyrene sulfonate) (PEDOT/PSS), and N,N-dinaphthyl-N,N-diphenylbenzidine (NPD), but the present disclosure is not limited thereto.

The first hole transporting layer 130*a* and the second hole transporting layer 130*b* may perform a function of smoothly transporting holes. To achieve this, they, for example, may include at least one material, among N,N-dinaphthyl-N,N-diphenylbenzidine), TPD(N,N-bis-(3-methylphenyl)-N,N-bis-(phenyl)-benzidine) (NPD), s-TAD, and 4,4',4''-Tris(N-3-methylphenyl-N-phenyl-amino)-triphenylamine) (MTDATA), but the present disclosure is not limited thereto.

The first electron transporting layer 150a and the second electron transporting layer 150b may transport electrons to the light exiting layer. To achieve this, they, for example, may include at least one material of Alq3, PBD, TAZ, Spiro-PBD, BAlq, Liq (lithium quinolate), BMB-3T, PF-6P, TPM, COT, and SAlq, but the present disclosure is not limited thereto.

The first electron injection layer 160a and the second electron injection layer 160b may inject electrons to the electron transporting layer. To achieve this, they may include at least one material of Alq3(tris(8-hydroxyquinolino)aluminum), PBD, TAZ, Spiro-PBD, BAlq, and SAlq.

The first light emitting layer 140a may include a blue light emitting layer, a dark blue light emitting layer, a sky blue light emitting layer, a red-blue light emitting layer, a yellow-green light emitting layer, or a green light emitting layer. The peak wavelengths of the light emission areas of the blue light emitting layer, the dark blue light emitting layer, and the sky blue light emitting layer may be in a range of 440 nm to 480 nm. The peak wavelength of the light emission area of the red-blue light emitting layer may be in a range of 600 nm to 650 nm. Further, the peak wavelength of the light emission area of the yellow-green light emitting layer or the green light emitting layer may be in a range of 510 nm to 580 nm.

The second light emitting layer 140b may include a blue light emitting layer, a dark blue light emitting layer, a sky blue light emitting layer, a red-blue light emitting layer, a yellow-green light emitting layer, or a green light emitting layer. The peak wavelengths of the light emission areas of the blue light emitting layer, the dark blue light emitting layer, and the sky blue light emitting layer may be in a range of 440 nm to 480 nm. The peak wavelength of the light emission area of the red-blue light emitting layer may be a range of 600 nm to 650 nm. Further, the peak wavelength of the light emission area of the yellow-green light emitting layer or the green light emitting layer may be in a range of 510 nm to 580 nm.

According to an embodiment, the first light emitting layer 140a may emit light of a color having a peak between yellow and green, and the second light emitting layer 140a may emit blue light. Accordingly, the light emitted by the first light emitting layer 140a and the second light emitting layer 140b may be combined to have a white wavelength.

Then, the first light emitting layer 140a may include a first chiral material 190a, and the second light emitting layer 140b may include a second chiral material 190a. The first and second chiral materials 190a and 190b are the same as those described with reference to FIGS. 1 to 3, and a detailed description thereof will be omitted.

The charge generation layer 165 may be located between the first light emitting layer 140a and the second light emitting layer 140b. The charge generation layer 165 may adjust a charge balance between the first light emitting layer 140a and the second light emitting layer 140b. The charge generation layer 165 may include an N type charge generation layer and a P type charge generation layer. The N type charge generation layer may include an organic layer doped with an alkaline metal such as Li, Na, K, or Cs, or an alkaline earth metal such as Mg, Sr, Ba, or Ra. Further, the P type charge generation layer may include an organic layer including a P type dopant.

Until now, the first to third modifications of the first embodiment of the present disclosure have been described with reference to FIGS. 4 to 6. Hereinafter, a fourth modification of the first embodiment of the present disclosure will be described with reference to FIG. 7.

Figure 7:
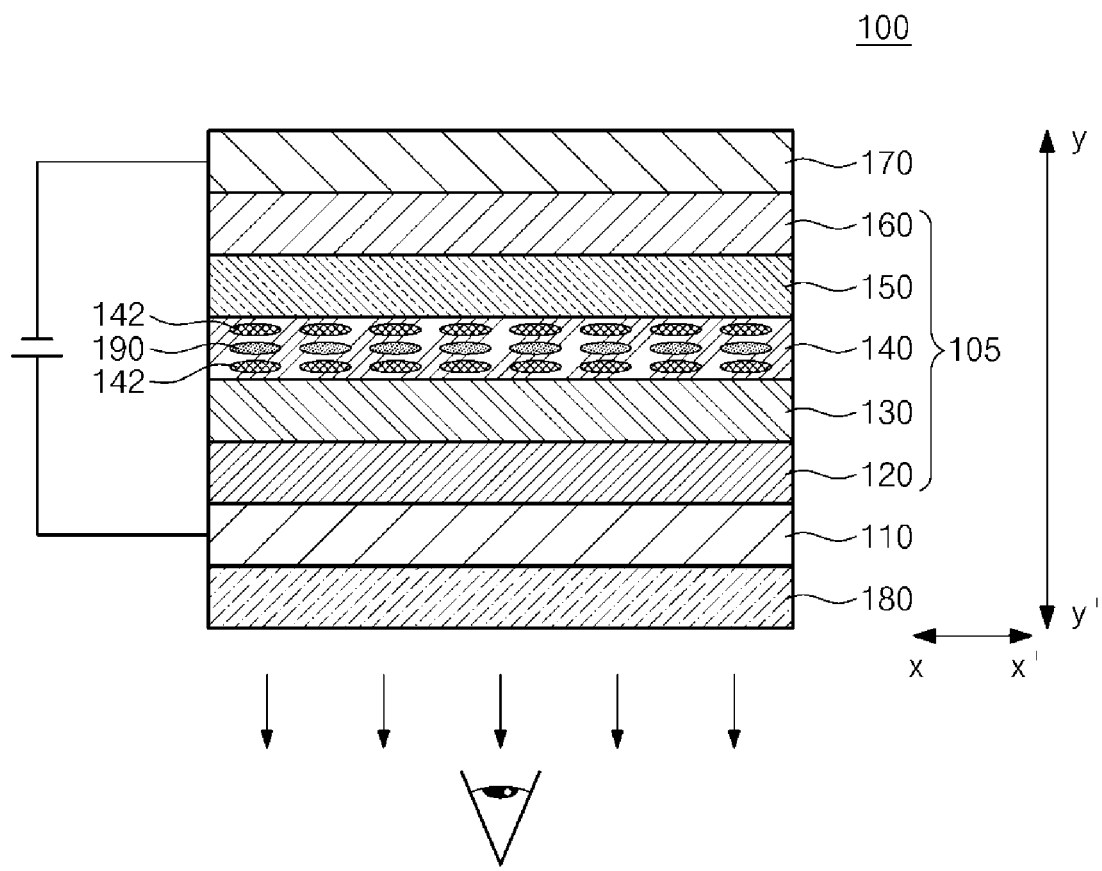
FIG. 7 is a view illustrating a fourth modification of the display according to the first embodiment of the present disclosure.

FIG. 7 is a view illustrating a fourth modification of the display according to the first embodiment of the present disclosure.

The fourth modification of the first embodiment of the present disclosure is different from the first embodiment, and the first to third modifications of the first embodiment of the present disclosure in that the molecules of the light exiting layer 105 are aligned. In addition, the structures and functions of the polarizing layer 180, the first electrode 110, the hole injection layer 120, the hole transporting layer 130, the electron transporting layer 150, the electron injection layer 160, and the second electrode 170 correspond to the structures and functions described with reference to FIGS. 1 to 3 previously, and a detailed description thereof will be omitted.

Referring to FIG. 7, it is apparent that the light emitting layer 140 according to the fourth modification of the first embodiment of the present disclosure may include the above-described chiral material 190, and is characterized in that the organic molecules that constitute the light emitting layer 140 may be aligned.

According to an embodiment, the organic molecules 142 of the light emitting layer 140 may be aligned in the x-x' direction as illustrated in FIG. 6 such that the long axes of the organic molecules 142 are substantially parallel to the first electrode 110 and the second electrode 170. Then, the organic molecules 142 and the chiral material 190 are aligned parallel to the first electrode and the second electrode, and the long axes of the organic molecules 142 are aligned in a manner in which they rotate spirally in the y axis direction.

Hereinafter, the effect according to the fourth modification of the first embodiment of the present disclosure will be described.

According to the fourth modification of the first embodiment of the present disclosure, the organic molecules 142 of the light emitting layer 140, for example, may be aligned in the x-x' direction of FIG. 7. Accordingly, the light exiting from the light emitting layer 140 may be linearly polarized. Further, the linearly polarized light generated in the light emitting layer 140 may have a polarization state in which the linearly polarized light rotates in the first direction and in the second direction due to the spirally laminated structure of the chiral light emitting molecules.

Then, because the light emitting layer 140 exits linearly polarized light due to the alignment of the organic molecules 142, the efficiency of the polarized light which rotates in the first direction and in the second direction may increase. That is, circular polarization efficiency (elliptical polarization efficiency) may increase when the linearly polarized light is exited due to the alignment of the organic molecules 142 as compared with the case in which the light emitting layer 140 exits non-polarized light. Accordingly, because the ratio of the light passing through the polarizing layer 180 to the first light Lin1 and the second light Lin2 described with reference to FIG. 3 increases, optical efficiency may be further enhanced.

Hereinafter, a method for aligning organic molecules will be described.

In order to align the organic molecules 142 of the light emitting layer 140, an adjacent layer that interfaces with the light emitting layer 140 may be oriented in a specific direction. For example, the hole transporting layer 130 formed earlier than the light emitting layer 140 may be oriented in a specific direction. Because a surface of the hole transporting layer 130 is aligned in a specific direction, the alignment of the light emitting layer 140 that interfaces with the hole transporting layer 130 may be guided to a specific direction.

For example, the hole transporting layer 130 may be aligned in a specific direction through rubbing. Unlike this, the hole transporting layer 130 may be aligned in a specific direction through orientation of the light that irradiates the linearly polarized light. Hereinafter, for convenience of description, a case of orientation of light is assumed.

For orientation of light, the hole transporting layer 130 may further include a high-molecular material selected form a group including polyimide, polyamic acid, polynorbornene, a penyl maleimide copolymer, polyvinylcinnamate, polyazobenzene, polyethyleneimine, polyvinyl alcohol, polyamide, polyethylene, polystylene, polyphenylenephthalamide, polyester, polyurethane, polysiloxanecinnamate, cellulosecinnamate based compound, and polymethyl methacrylate based compound. That is, the optically oriented material may be further included in the hole transporting material described with reference to FIG. 1. Unlike this, the hole transporting layer 130 may include only an optically oriented material.

An ultraviolet ray, for example, a linearly polarized, elliptically polarized, or circularly polarized ultraviolet ray or a non-polarized ultraviolet ray may be applied to the hole transporting layer 130. Accordingly, a surface of the hole transporting layer 130, for example, may be oriented in a specific direction, for example, in the x-x' direction.

The light emitting layer 140 may be formed on the oriented hole transporting layer 130. The organic molecules 142 and the chiral material 190 constituting the light emitting layer 140 may be formed in an orientation direction provided by the hole transporting layer 130, that is, in a state in which they are oriented in the x-x' direction.

Hereinafter, the structure and effects according to the fourth modification of the first embodiment of the present disclosure have been described. Although it has been described in the description of the fourth modification of the present disclosure that the organic molecules of the light emitting layer 140 are aligned, it is apparent that another layer, except for the light emitting layer 140 of the light exiting layer 105 may be aligned.

In detail, the technical spirit of the fourth modification may be applied to the first modification of the first embodiment. In this case, the organic molecules of the hole transporting layer 130 and the electron transporting layer 150, which include the chiral material 190, also may be aligned in a specific direction, for example, in the x-x' direction. When it is necessary to align the hole transporting layer 130, the hole injection layer 120 formed earlier than the hole transporting layer 130 may be rubbed or optically oriented. Further, when it is necessary to align the electron transporting layer 150, the light emitting layer 140 formed earlier than the electron transporting layer 150 may be rubbed or optically oriented. Accordingly, the organic molecules of the hole transporting layer 130 and the electron transporting layer 150 also may be aligned in a specific direction, for example, in the x-x' direction.

Further, the technical spirit of the fourth modification may be applied to the second modification of the first embodiment. In this case, the organic molecules of the hole injection layer 120 and the electron injection layer 160, which include the chiral material 190 also may be aligned in a specific direction, for example, in the x-x' direction. When it is necessary to align the hole injection layer 120, an oriented layer oriented in a specific direction may be formed between the first electrode 110 and the hole injection layer 120. When it is necessary to align the electron injection layer 160, the electron transporting layer 150 formed earlier than the electron injection layer 160 may be rubbed or optically oriented. Accordingly, the organic molecules of the hole injection layer 120 and the electron injection layer 160 also may be aligned in a specific direction, for example, in the x-x' direction.

Further, the technical spirit of the fourth modification may be applied to the third modification of the first embodiment. In this case, the organic molecules of the first light emitting layer 140a including the first chiral material 190a and the second light emitting layer 140b including the second chiral material 190b may be aligned in a specific direction, for example, in the x-x' direction. To achieve this, the organic molecules (not illustrated) of the first light emitting layer 140a may be aligned through a rubbing or optical orientation process in the above-described method. Thereafter, the organic molecules (not illustrated) of the second light emitting layer 140b may be aligned in a specific direction by orienting the second hole transporting layer 130b through the linearly polarized light exiting from the first light emitting layer 140a. Then, the first light emitting layer 140a may emit blue light, and the second light emitting layer 140b may emit yellow-green (YG) light. Accordingly, the number of the organic molecule aligning processes can be reduced.

It is apparent that the technical spirit of the first embodiment of the present disclosure, and the first modification, the second modification, the third modification, and the fourth modification thereof may be combined to be carried out.

Until now, the displays according to the first embodiment of the present disclosure and the modifications thereof have been described with reference to FIGS. 1 to 7. Hereinafter, utilization examples of the first embodiment of the present disclosure and the modifications thereof will be described with reference to FIG. 8.

Figure 8:
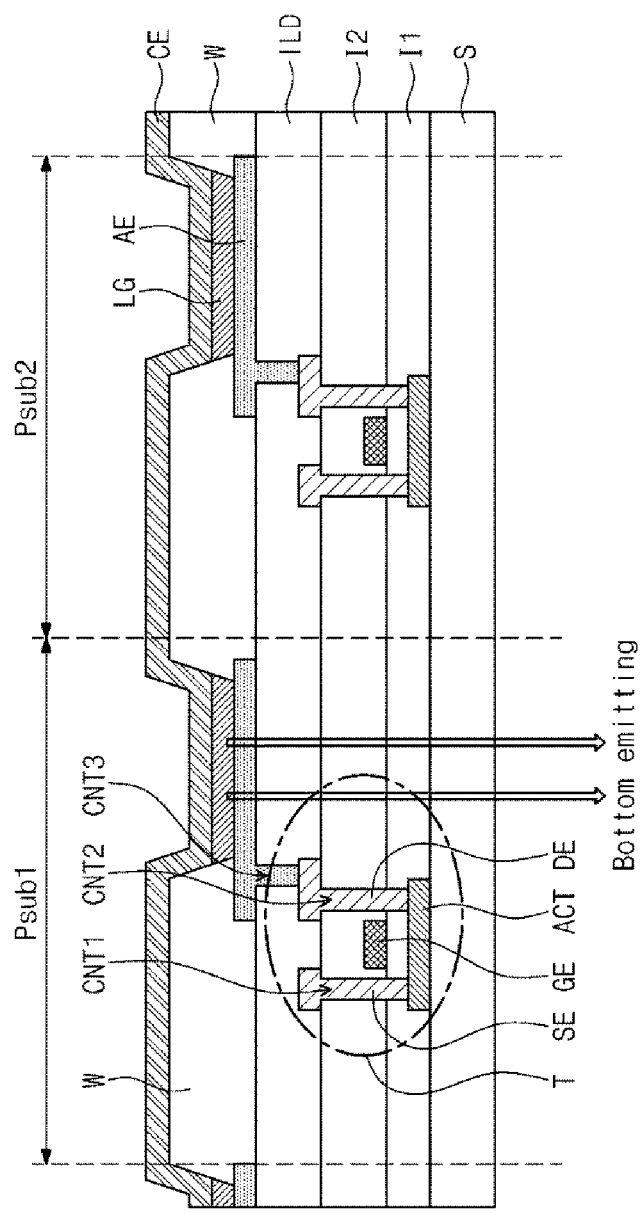
FIG. 8 is a view illustrating utilization examples of the display according to the first embodiment of the present disclosure, and the modifications thereof.

FIG. 8 is a view illustrating utilization examples of the display according to the first embodiment of the present disclosure, and the modifications thereof.

The above-described display according to the first embodiment of the present disclosure, and the modifications thereof may be applied to a top emission display device.

Referring to FIG. 8, a bottom emission display device may include a substrate S.

The substrate S may be a flexible substrate, for example, of at least one material of polyethylene terephthalate (PET), polyethylenaphthalate (PEN), and polyimide (PI) as well as a glass substrate.

Pixels, for example, sub-pixels Psub1 and Psub2 may be provided on the substrate S. The sub-pixels Psub1 and Psub2 may include a transistor element T, an anode electrode AE, a light exiting layer LG, and a cathode electrode CE.

The transistor element T may be provided on the substrate S, and may include an active layer ACT, a first insulation film I1 provided on the active layer ACT, a gate electrode GE provided on the first insulation film I1, a second insulation film I2 provided on the gate electrode GE, and a source electrode SE and a drain electrode DE provided on the second insulation film I2 and contacting the active layer ACT through first and second contact holes CNT1 and CNT2. The transistor element T, unlike the above description, may be implemented in other methods.

The transistor element T may deliver a driving signal applied to the source electrode SE to the anode electrode AE through the drain electrode DE. That is, when an on signal is applied to the gate electrode GE of the transistor element T, a driving signal may be applied to the anode electrode AE.

The gate electrode GE may include a signal layer or a multilayer of at least one metal or alloy of Al, Pt, Pd, Ag, Mg, Au, Ni, Nd, Ir, Cr, Li, Ca, Mo, Ti, W, and Cu.

The active layer ACT may include a semiconductor material, and the semiconductor material may have an amorphous and/or crystalline material. For example, the active layer ACT may include at least one material of IGZO, ZnO, SnO2, In2O3, Zn2SnO4, and Ge2O3.

The source electrode SE and the drain electrode DE, for example, may include a signal layer or a multilayer of at least one metal or alloy of Al, Pt, Pd, Ag, Mg, Au, Ni, Nd, Ir, Cr, Li, Ca, Mo, Ti, W, and Cu.

An interlayer insulation film ILD may be provided on the source electrode SE and the drain electrode DE.

The anode electrode AE may be provided on the interlayer insulation film ILD, and the anode electrode AE may be connected to the drain electrode ED through a third contact hole CNT3 formed in the interlayer insulation layer ILD.

Meanwhile, a partition wall may be formed between the sub-pixels, and accordingly, the sub-pixels may be divided. The partition wall may include at least one material of an organic insulation material, such as a silicon nitride (SiNx) or a silicon oxide (SiOx) or an organic material, such as benzocyclobutene or an acrylic resin.

The light exiting layer LG may be formed on the anode electrode AE for respective sub-pixels. For example, the light exiting layer LG may include a hole injection layer, a hole transporting layer, a light emitting layer, an electron transporting layer, and an electron injection layer. Then, the light emitting layer may be provided such that light of different colors may be exited for respective sub-pixels. Accordingly, light of different colors may be exited for respective sub-pixels. Unlike this, in the case of a tandem structure, pixels may be provided such that white light may be commonly exited. In this case, colors may be realized through color filters.

The cathode electrode CE may be provided on the light emitting layer LG and the partition wall. For example, the cathode electrode CE may provide electrons to the light exiting layer LG.

An encapsulation layer and/or a counter substrate may be provided on the cathode electrode CE. The encapsulation layer and/or the counter substrate may block moisture and/or oxygen that may penetrate into the display device.

The bottom emission display device may exit the generated light toward the substrate. The bottom emission display device exits light toward the anode electrode, and thus the cathode electrode may be formed of a highly conductive material. Accordingly, the bottom emission display device may be advantageous in a large-area display device.

The light exiting layers of the first embodiment of the present disclosure and the modifications thereof may be applied to the light emitting layer LG of the bottom emission display device.

Until now, the display according to the first embodiment of the present disclosure has been described. Hereinafter, a display according to the second embodiment of the present disclosure will be described with reference to FIGS. 9 to 14. While the display according to the first embodiment of the present disclosure is of a bottom emission type, the display according to the second embodiment of the present disclosure, which will be described below, is of a top emission type.

Figure 9:
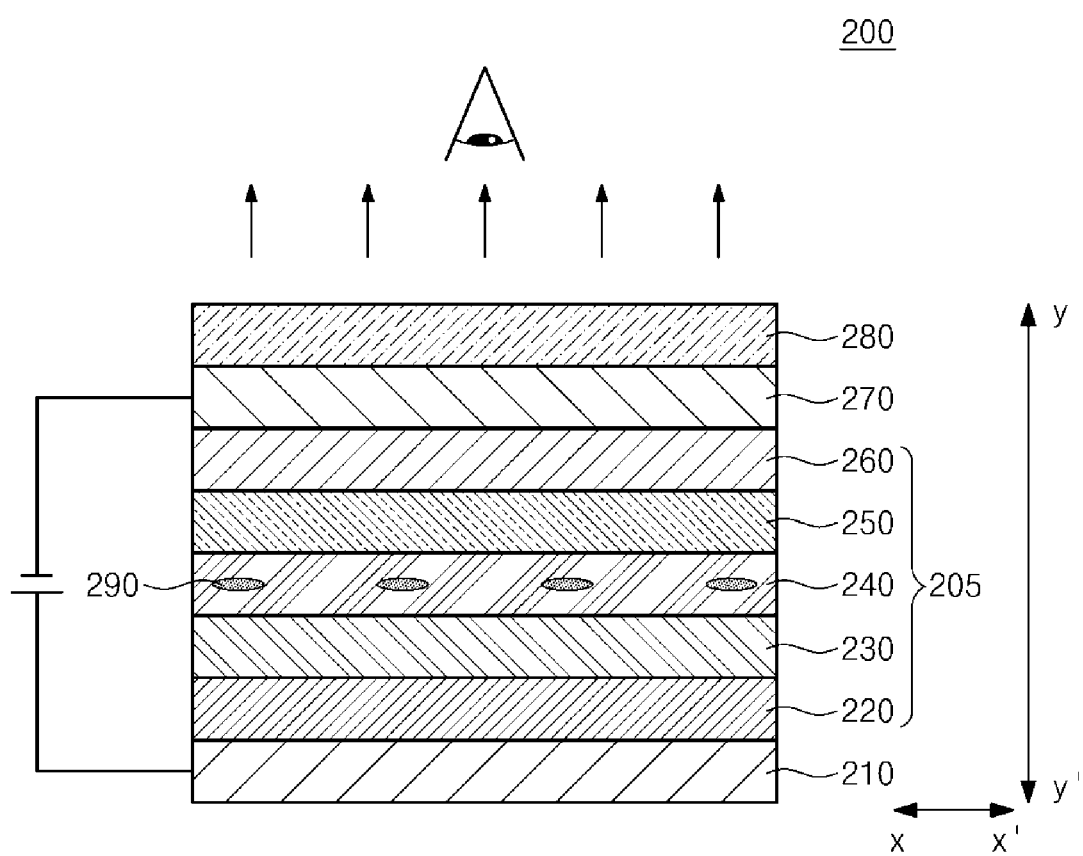
FIG. 9 illustrates a partially cross-sectional view illustrating a display according to a second embodiment of the present disclosure.

FIG. 9 illustrates a partially cross-sectional view illustrating a display according to a second embodiment of the present disclosure.

Referring to FIG. 9, the display according to the second embodiment of the present disclosure may have a structure in which a substrate (not illustrated), an active layer (not illustrated), a first electrode 210, a light exiting layer 205, a second electrode 270, a polarizing layer 280 are laminated in the sequence thereof in the direction of y' toy.

The first electrode 210 according to the second embodiment, unlike the first electrode 110 of the first embodiment, may include an electrode material of a high conductivity having an opaque property such that a reflective surface is provided. For example, the first electrode 210 may include a transparent conductive material layer having a high work function, such as indium-tin-oxide (ITO), and a reflective material layer such as silver (Ag) or a silver (Ag) alloy.

The first electrode 210 may be a sharing electrode that may be shared by adjacent pixels, and may be divided to be formed for respective pixels. Hereinafter, for convenience of description, it is assumed that the first electrode 210 is a division electrode. In this case, the first electrode 110 may be individually controlled for respective pixels.

The light exiting layer 205 may be configured to emit red light, blue light, and green light for respective pixels. For example, the light exiting layer 205 may include a hole injection layer 220, a hole transporting layer 230, a light emitting layer 240, an electron transporting layer 250, and an electron injection layer 260.

The hole injection layer 220, the hole transporting layer 230, the light emitting layer 240, the electron transporting layer 250, and the electron injection layer 260 according to the first embodiment correspond to the hole injection layer 120, the hole transporting layer 130, the light emitting layer 140, the electron transporting layer 150, and the electron injection layer 160 according to the second embodiment, respectively, and a detailed description thereof will be omitted.

The light emitting layer 240 according to the second embodiment also may include the chiral material 290. The chiral material 290 may provide a distortion angle such that the organic light emitting molecules that constitute the light emitting layer 240 have a spiral lamination structure. By the chiral spiral lamination structure, as for the light generated in the light emitting layer 240, first light having a polarization state in which the first light rotates in the first direction (the counterclockwise direction with respect to the travel direction thereof, that is, the counterclockwise direction with respect to the y'-y path) is exited toward the second electrode 270, and second light having a polarization state in which the second light rotates in the second direction (the clockwise direction with respect to the travel direction thereof, that is, the clockwise direction with respect to the y'-y path), which is opposite to the first direction, is exited toward the first electrode 210.

The second electrode 270 may include a transparent electrode to exit the light in they direction.

According to an embodiment, the second electrode 270 may include a sharing electrode shared by sub-pixels.

A capping layer (not illustrated) may be formed on the second electrode 270. The capping layer functions to improve a light extraction effect. The capping layer may include an organic material that has a hole transporting capability, and may include a host material that constitutes the light emitting layer. However, the capping layer may be omitted.

Meanwhile, although not illustrated on the second electrode 270, an encapsulation layer for preventing moisture penetration may be formed.

A polarizing layer 280 may be formed on the second electrode 270. The polarizing layer 280 may include a circular polarizing layer and a linear polarizing layer located in the y direction with respect to the circular polarizing layer. The polarizing layer 280 may optionally transmit light corresponding to the polarization state of the circular polarizing layer. Then, the circular polarizing layer of the polarizing layer 280 may optionally transmit light having a polarization state in which the light rotates in the first direction. That is, the polarizing layer 280 may block the light having a polarization state in which the light rotates in the second direction such that the light cannot pass through the polarizing layer 280.

Until now, the display according to the second embodiment of the present disclosure has been described with reference to FIG. 8. Hereinafter, an operation example of the display according to the second embodiment of the present disclosure will be described with reference to FIG. 9.

Figure 10:
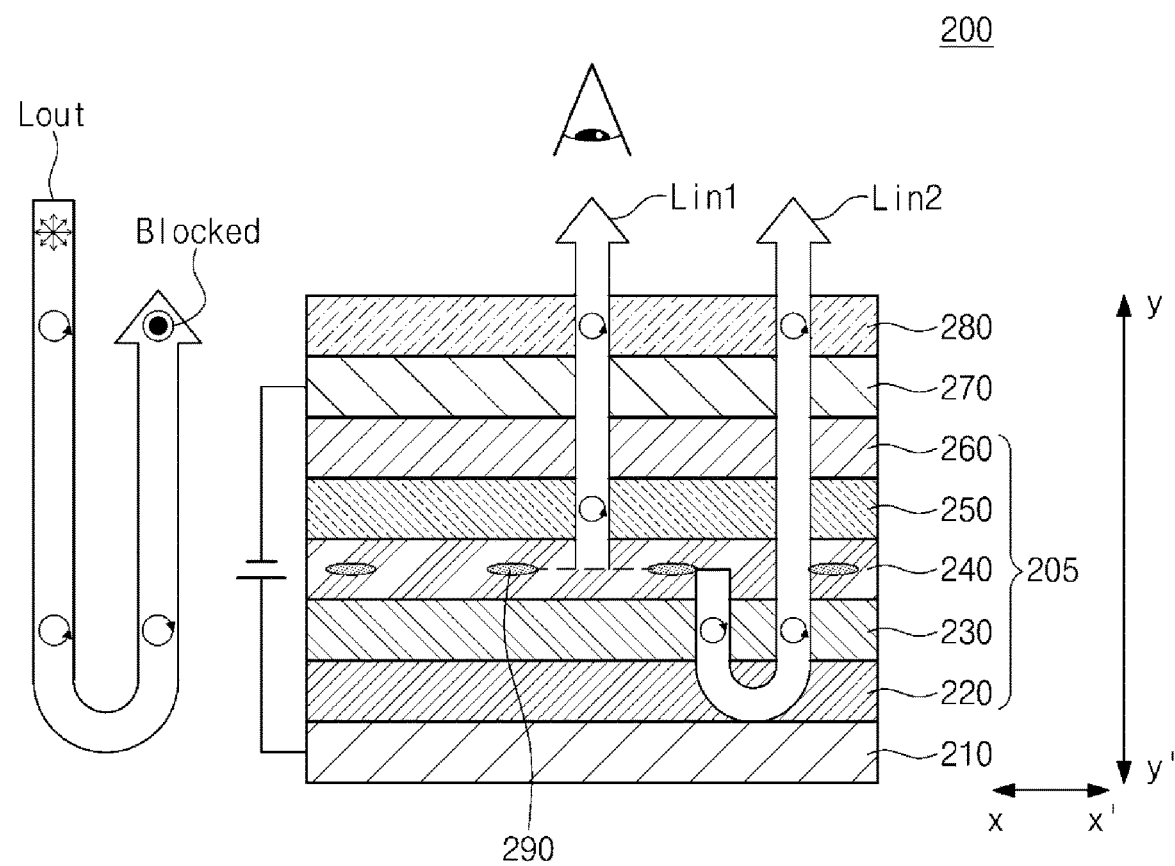
FIG. 10 is a view illustrating an operation example of the display according to the second embodiment of the present disclosure.

FIG. 10 is a view illustrating an operation example of the display according to the second embodiment of the present disclosure.

The display according to the second embodiment of the present disclosure also can prevent reflection of external light like the display according to the above-described first embodiment of the present disclosure, and can maximize optical efficiency.

The display 200 can provide an external light blocking effect such that the external light Lout input in the y to y' direction is prevented from being reflected in the interior of the display 100 and being delivered to the viewer.

Referring to FIG. 10, first, an environment in which the external light Lout may enter the interior of the display 200 may be created. Then, the external light Lout may have a non-polarized state before entering the display 200. However, because the polarizing layer 280 optionally transmits the light that rotates in the first direction, that is, counterclockwise with respect to the travel direction of the light, it can have a polarization state in which the external light Lout rotates in the first direction that is a counterclockwise direction when viewed from y' with respect to the light travel direction (from y to y') after the external light Lout passes through the polarizing layer 280 of the display 200.

The external light Lout having a polarization state in which the external light Lout rotates in the first direction that is the counterclockwise direction may travel from the y direction to the y' direction. Accordingly, the external light Lout having the polarization state in which the external light Lout rotates in the first direction may pass through the light exiting layer 205, and may be reflected by the first electrode 210. Accordingly, the travel direction of the external light Lout may be changed from the y to y' direction to the y' to y direction. The rotational direction of the polarization state of the external light Lout may be changed by reflection. That is, the polarization direction of the external light Lout may be changed from the first direction that is the counterclockwise direction with respect to the travel direction (from y' to y) to the second direction that is the clockwise direction with respect to the travel direction (from y' to y). The external light Lout having the polarization state in which the external light Lout rotates in the second direction by the reflection of the first electrode 210 may pass through the light exiting layer 205, and may reach the polarizing layer 280. However, the external light Lout having the polarization state in which the external light Lout rotates in the second direction cannot pass through the polarizing layer 280 that optionally transmits the light that rotates in the first direction. Accordingly, even when the external light Lout is irradiated to the interior of the display 200, the external light Lout that entered into the display 200 can be prevented from being viewed by a viewer.

Until now, the effect of preventing reflection of the external light by the display according to the second embodiment of the present disclosure has been described. Hereinafter, an example of maximizing optical efficiency will be described.

The light generated in the light emitting layer 240 may be classified into first light Lin1 that travels toward the second electrode 270 and second light Lin2 that travels toward the first electrode 210. Then, the light generated in the light emitting layer 240 may have a rotary polarization state by the light emitting molecules laminated in the spiral shape by the chiral material 290.

In detail, the first light Lin1 may have a polarization state in which the first light Lin1 rotates in the first direction that is the counterclockwise direction with respect to the chiral light travel direction (from y' to y). The first light Lin1 having a polarization state in which the first light Lin1 rotates in the first direction may pass through the polarizing layer 280. Accordingly, the first light Lin1 may be delivered to the viewer.

The second light Lin2 may have a polarization state in which the second light Lin2 rotates in the second direction that is the clockwise direction with respect to the chiral light travel direction (from y to y'). The second light Lin2 having a polarization state in which the second light Lin2 rotates in the second direction may be reflected by the first electrode 210. The second light Lin2 reflected by the first electrode 210 may have a polarization state in which the second light Lin2 rotates in the first direction that is the counterclockwise direction with respect to the light travel direction (from y' to y). The second light Lin2 having a polarization state in which the second light Lin2 rotates in the first direction may pass through the polarizing layer 280. Accordingly, the second light Lin2 may be delivered to the viewer.

In summary, the light generated in the light emitting layer 240 may have a random path and may be largely classified into first light Lin1 that travels toward the second electrode 270 and second light Lin2 that travels toward the first electrode 210. Then, the first light Lin1 may pass through the polarizing layer 280 because it has a polarization state in which the first light Lin1 rotates in the first direction, and the second light Lin2 may have a polarization state in which the second light Lin2 rotates in the first direction because the second light Lin2 initially has a polarization state in which the second light Lin2 rotates in the second direction but is reflected by the first electrode 210. Accordingly, the second light as well as the first light may pass through the polarizing layer 280. Accordingly, the optical efficiency of delivery to the viewer can be maximized.

Until now, the operation example of the display according to the second embodiment of the present disclosure has been described with reference to FIG. 10. Hereinafter, a first modification of the second embodiment of the present disclosure will be described with reference to FIG. 11.

Figure 11:
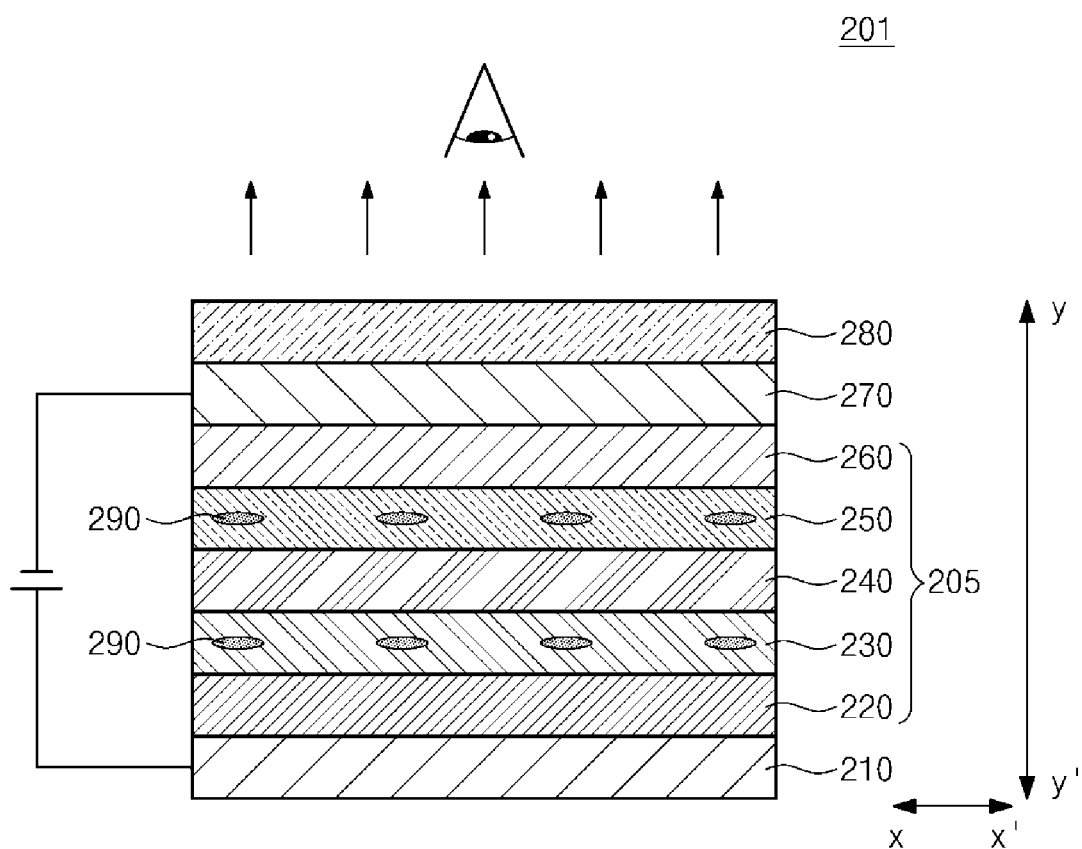
FIG. 11 is a view illustrating a first modification of the display according to the second embodiment of the present disclosure.

FIG. 11 is a view illustrating a first modification of the display according to the second embodiment of the present disclosure.

Referring to FIG. 11, according to the second modification of the present disclosure, the chiral material 290 may be included in at least one layer of the hole transporting layer 230 and the electron transporting layer 250. In this case, the chiral material 290 may laminate the molecules constituting the hole transporting layer 230 and/or the molecules constituting the electron transporting layer 250 in a spiral structure in the thickness direction of the molecules.

In this case, among the light generated in the light emitting layer 240, the first light Lin 1 that faces the second electrode 270 may have a chiral rotary polarization state by the electron transporting layer 250 in which the molecules have a spiral lamination structure. That is, because the first light Lin1 has a polarization state in which the first light Lin1 rotates in the first direction, it may pass through the polarizing layer 280.

Further, among the light generated in the light emitting layer 240, the second light Lin2 that faces the first electrode 210 may have a chiral rotary polarization state by the hole transporting layer 230 in which the molecules have a spiral lamination structure. That is, the second light Lin2 has a polarization state in which the second light Lin2 rotates in the second direction, and may have a polarization state in which the second light Lin2 rotates in the first direction because the second light Lin2 is reflected by the first electrode 210 as described above. Accordingly, the second light Lin2 may pass through the polarizing layer 280.

It has been described that the chiral material 290 is included in the hole transporting layer 230 and the electron transporting layer 250 according to the first modification of the second embodiment of the present disclosure with reference to FIG. 11, it is apparent that the chiral material 290 is included in the light emitting layer 240 as well as the hole transporting layer 230 and the electron transporting layer 250.

Figure 12:
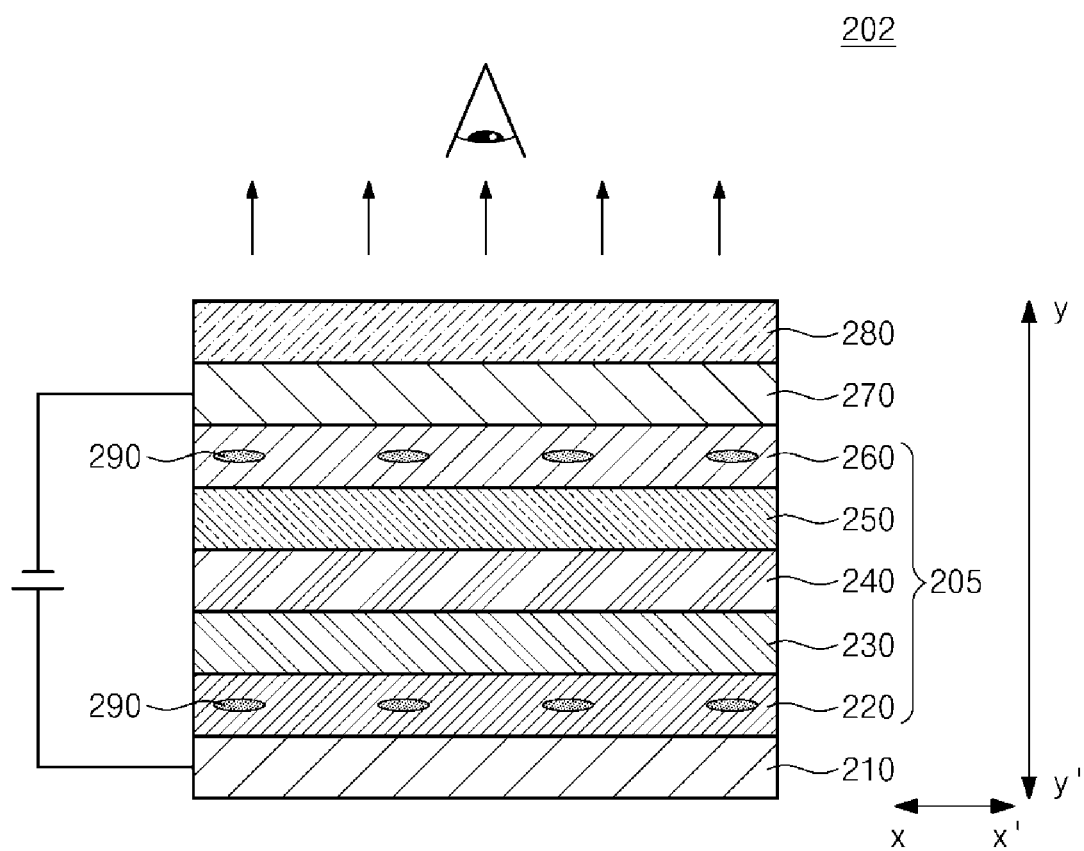
FIG. 12 is a view illustrating a second modification of the display according to the second embodiment of the present disclosure.

FIG. 12 is a view illustrating a second modification of the display according to the second embodiment of the present disclosure.

Referring to FIG. 12, according to the second modification of the present disclosure, the chiral material 290 may be included in at least one layer of the hole injection layer 220 and the electron injection layer 260. In this case, the chiral material 290 may laminate the molecules constituting the hole transporting layer 220 and/or the molecules constituting the electron transporting layer 260 in a spiral structure in the thickness direction of the molecules.

In this case, among the light generated in the light emitting layer 240, the first light Lin 1 that faces the second electrode 270 may have a chiral rotary polarization state by the electron injection layer 260 in which the molecules have a spiral lamination structure. That is, because the first light Lin1 has a polarization state in which the first light Lin1 rotates in the first direction, it may pass through the polarizing layer 280.

Further, among the light generated in the light emitting layer 240, the second light Lin2 that faces the first electrode 210 may have a chiral rotary polarization state by the hole injection layer 220 in which the molecules have a spiral lamination structure. That is, the second light Lin2 has a polarization state in which the second light Lin2 rotates in the second direction, and may have a polarization state in which the second light Lin2 rotates in the first direction because the second light Lin2 is reflected by the first electrode 210 as described above. Accordingly, the second light Lin2 may pass through the polarizing layer 280.

It has been described that the chiral material 290 is included in the hole injection layer 220 and the electron injection layer 260 according to the second modification of the present disclosure with reference to FIG. 12, it is apparent that the chiral material 290 is included in at least one of the light emitting layer 240, the hole transporting layer 230 and the electron transporting layer 250.

Figure 13:
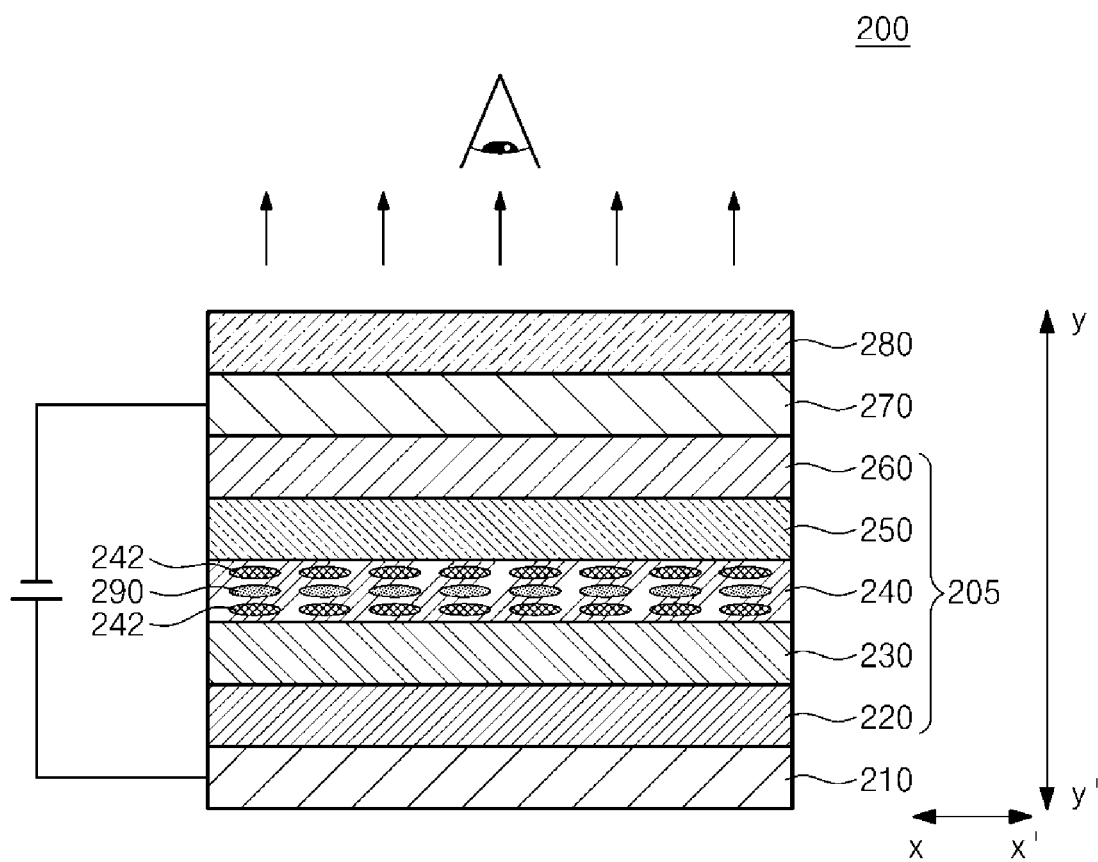
FIG. 13 is a view illustrating a third modification of the display according to the second embodiment of the present disclosure.

FIG. 13 is a view illustrating a third modification of the display according to the second embodiment of the present disclosure;

The third modification of the second embodiment of the present disclosure is different from the second embodiment, and the first and second modifications of the second embodiment of the present disclosure in that the molecules of the light exiting layer 205 are aligned. In addition, the structures and functions of the polarizing layer 280, the first electrode 210, the hole injection layer 220, the hole transporting layer 230, the electron transporting layer 250, the electron injection layer 260, and the second electrode 270 correspond to the structures and functions described with reference to FIGS. 9 and 10 previously, and a detailed description thereof will be omitted.

Referring to FIG. 13, it is apparent that the light emitting layer 240 according to the third modification of the second embodiment of the present disclosure may include the above-described chiral material 290, and is characterized in that the organic molecules that constitute the light emitting layer 240 may be aligned.

Figure 14:
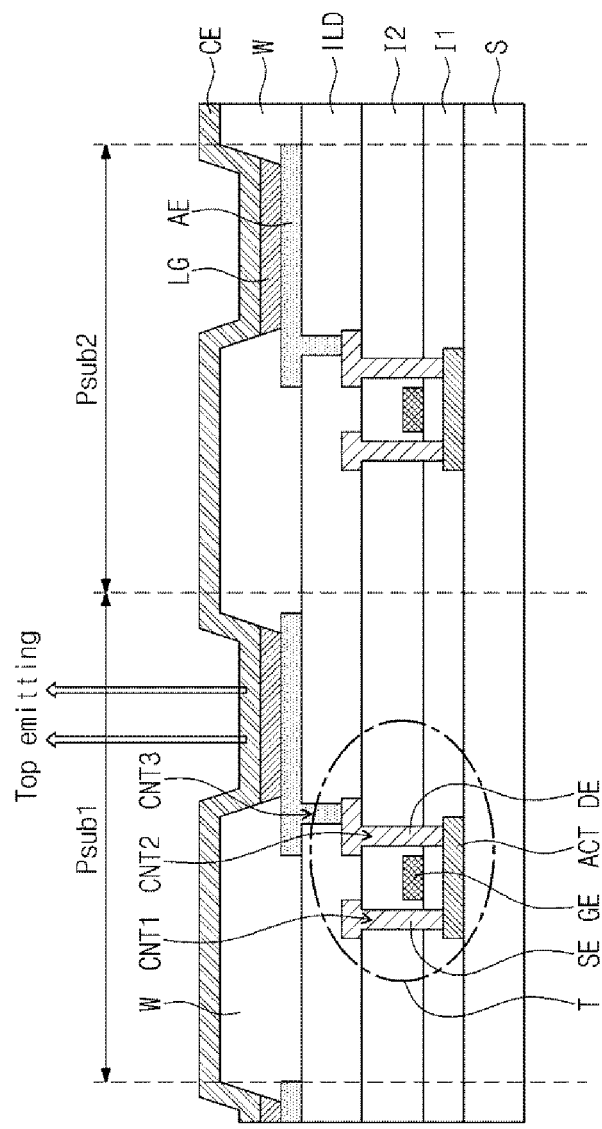
FIG. 14 is a view illustrating utilization examples of the display according to the second embodiment of the present disclosure, and the modifications thereof.

According to an embodiment, the organic molecules 242 of the light emitting layer 240 may be aligned in the x-x' direction as illustrated in FIG. 14 such that the long axes of the organic molecules 242 are substantially parallel to the first electrode 210 and the second electrode 270. Then, the organic molecules 242 and the chiral material 190 are aligned parallel to the first electrode and the second electrode, and the long axes of the organic molecules 242 are aligned in a manner in which they rotate spirally in the y axis direction.

The method for aligning organic molecules correspond to that described above in the fourth of the first embodiment, and a detailed description thereof will be omitted.

Hereinafter, the effect according to the third modification of the second embodiment of the present disclosure will be described. According to the third modification of the second embodiment of the present disclosure, the organic molecules 242 of the light emitting layer 240, for example, may be aligned in the x-x' direction of FIG. 13 in a specific direction. Accordingly, the light exiting from the light emitting layer 240 may be linearly polarized. Further, the linearly polarized light generated in the light emitting layer 240 may have a polarization state in which the linearly polarized light rotates in the first direction and in the second direction due to the spiral structure formed as the organic molecules 242 are distorted in a layer shape.

Then, because the light emitting layer 240 exits linearly polarized light due to the alignment of the organic molecules 242, the efficiency of the polarized light which rotates in the first direction and in the second direction may increase. That is, circular polarization efficiency (elliptical polarization efficiency) may increase when the linearly polarized light is exited due to the alignment of the organic molecules 242 as compared with the case in which the light emitting layer 240 exits non-polarized light. Accordingly, because the ratio of the light passing through the polarizing layer 280 to the first light Lin1 and the second light Lin2 described with reference to FIG. 10 increases, optical efficiency may be further enhanced.

Hereinafter, the structure and effects according to the third modification of the second embodiment of the present disclosure have been described. Although it has been described in the description of the third modification of the second embodiment of the present disclosure that the organic molecules of the light emitting layer 240 are aligned, it is apparent that another layer, except for the light emitting layer 240 of the light exiting layer 205 may be aligned.

In detail, the technical spirit of the third modification may be applied to the first modification of the second embodiment. In this case, the organic molecules of the hole transporting layer 230 and the electron transporting layer 250, which include the chiral material 290, also may be aligned in a specific direction, for example, in the x-x' direction.

Further, the technical spirit of the third modification may be applied to the second modification of the second embodiment. In this case, the organic molecules of the hole injection layer 220 and the electron injection layer 260, which include the chiral material 290 also may be aligned in a specific direction, for example, in the x-x' direction.

It is apparent that the technical spirit of the second embodiment of the present disclosure, and the first modification, the second modification, and the third modification thereof may be combined to be carried out.

FIG. 14 is a view illustrating utilization examples of the display according to the second embodiment of the present disclosure, and the modifications thereof.

The above-described display according to the second embodiment of the present disclosure, and the modifications thereof may be applied to a top emission display device.

Referring to FIG. 14, a top emission display device may include a substrate S.

The substrate S may be a flexible substrate, for example, of at least one material of polyethylene terephthalate (PET), polyethylenaphthalate (PEN), and polyimide (PI) as well as a glass substrate.

Pixels, for example, sub-pixels Psub1 and Psub2 may be provided on the substrate S. The sub-pixels Psub1 and Psub2 may include a transistor element T, an anode electrode AE, a light exiting layer LG, and a cathode electrode CE.

The transistor element T may be provided on the substrate S, and may include an active layer ACT, a first insulation film I1 provided on the active layer ACT, a gate electrode GE provided on the first insulation film I1, a second insulation film I2 provided on the gate electrode GE, and a source electrode SE and a drain electrode DE provided on the second insulation film I2 and contacting the active layer ACT through first and second contact holes CNT1 and CNT2. The transistor element T, unlike the above description, may be implemented in other methods.

The transistor element T may deliver a driving signal applied to the source electrode SE to the anode electrode AE through the drain electrode DE. That is, when an on signal is applied to the gate electrode GE of the transistor element T, a driving signal may be applied to the anode electrode AE.

The gate electrode GE may include a signal layer or a multilayer of at least one metal or alloy of Al, Pt, Pd, Ag, Mg, Au, Ni, Nd, Ir, Cr, Li, Ca, Mo, Ti, W, and Cu.

The active layer ACT may include a semiconductor material, and the semiconductor material may have an amorphous and/or crystalline material. For example, the active layer ACT may include at least one material of IGZO, ZnO, SnO2, In2O3, Zn2SnO4, and Ge2O3.

The source electrode SE and the drain electrode DE, for example, may include a signal layer or a multilayer of at least one metal or alloy of Al, Pt, Pd, Ag, Mg, Au, Ni, Nd, Ir, Cr, Li, Ca, Mo, Ti, W, and Cu.

An interlayer insulation film ILD may be provided on the source electrode SE and the drain electrode DE.

The anode electrode AE may be provided on the interlayer insulation film ILD, and the anode electrode AE may be connected to the drain electrode ED through a third contact hole CNT3 formed in the interlayer insulation layer ILD.

Meanwhile, a partition wall may be formed between the sub-pixels, and accordingly, the sub-pixels may be divided. The partition wall may include at least one material of an organic insulation material, such as a silicon nitride (SiNx) or a silicon oxide (SiOx) or an organic material, such as benzocyclobutene or an acrylic resin.

The light exiting layer LG may be formed on the anode electrode AE for respective sub-pixels. For example, the light exiting layer LG may include a hole injection layer, a hole transporting layer, a light emitting layer, an electron transporting layer, and an electron injection layer. Then, the light emitting layer may be provided such that light of different colors may be exited for respective sub-pixels. Accordingly, light of different colors may be exited for respective sub-pixels.

The cathode electrode CE may be provided on the light emitting layer LG and the partition wall. For example, the cathode electrode CE may provide electrons to the light exiting layer LG.

An encapsulation layer and/or a counter substrate may be provided on the cathode electrode CE. The encapsulation layer and/or the counter substrate may block moisture and/or oxygen that may penetrate into the display device.

The top emission display device may exit the generated light in a direction that is opposite to the substrate. Accordingly, the top emission display device has an advantage of a wide space for forming the transistor element T and an enhanced opening degree.

The light exiting layers of the second embodiment of the present disclosure and the modifications thereof may be applied to the light exiting layer LG of the top emission display device.

Hereinafter, the experimental examples of the present disclosure and the excellence of the present disclosure will be described.

For the experiments, the top light emission display according to the embodiment of the present disclosure was prepared. In more detail, the display according to the first experimental example was prepared to include an anode electrode including LIF/Al, a hole blocking layer formed on the anode electrode and including TPBi, a light emitting layer formed on the hole blocking layer and including a chiral dopant, of which the light emitting molecules are F8BT and which provides a R5011 with a rightward distortion angle, a hole transporting layer formed on the light emitting layer and including polyimide, a hole injection layer formed on the hole transporting layer and including CuPC, and a cathode electrode formed on the hole injection layer and including an ITO. Then, in the display according to the first experiment, the light emitting molecules were aligned by orienting the hole transporting layer including polyimide. That is, it may be considered that the first experimental example corresponds to the above-described third modification of the second embodiment.

Further, as the second experimental example, a display which includes the same material as that of the first experimental example and is not oriented was prepared. That is, it may be considered that the second experimental example corresponds to the second embodiment.

In order to compare it from the first experimental example and the second experimental examples of the present disclosure, the first comparative example and the second comparative example, in which a chiral dopant of R5011 is not included, were prepared. In particular, the light emitting layer of the first comparative example was configured to include F8BT light emitting molecules that are not oriented, and the light emitting layer of the second comparative example was configured to include F8BT light emitting molecules that are oriented. As described above, the light emitting layers of the first comparative example and the second comparative example do not include a chiral dopant.

Table 1 is a table for comparing characteristics of the first experimental example, the second experimental example, the first comparative example, and the second comparative example.

TABLE 1

| Category | First experi- mental example | Second experi- mental example | First compar- ative example | Second compar- ative example |
|---|---|---|---|---|
| Sample only | 4029 | 4031 | 4023 | 4014 |
| Right circular polarized plate | 2861 | 2490 | 1839 | 1800 |
| Left circular polarized plate | 792 | 1175 | 1819 | 1837 |
| Sum of R + L | 3652 | 3665 | 3658 | 3637 |
| Circular polarization ratio | 3.61 | 2.12 | 1.01 | 0.97 |
| Enhancement of efficiency | 56.6% | 35.9% | Reference | Reference |
| g-factor | −1.13 | −0.71 | 0 | 0 |

Sample only described in the category column of Table 1 refers to the intensity of exiting light when a polarized plate is not formed on an exit surface, and the right circular polarized plate and the left circular polarized plate refer to the intensities of exiting light when the right/left circular polarized plates are formed on the exit surface, respectively. Sum of R+L refers to the intensity of light that passed through the left/right circular polarized plates.

Referring to Table 1, it could be identified from the first comparative example and the second comparative example that the light generated by the light emitting layer is in a non-polarization state because the g-factor of the light is 0. Unlike this, in the first experimental example, it could be identified that the g-factor of the light generated in the light emitting layer was as much as −1.13 and efficiency was increased by about 60%. Further, in the second experimental example, it could be identified that the g-factor of the light generated in the light emitting layer was −0.71 and efficiency was increased by about 40%.

It is construed that the g-factor was increased because the chiral dopants included in the first and second experimental examples provided a distortion angle to the light emitting molecules and the light generated by the light emitting molecules has a rotary polarization state due to the spiral structure including the light emitting molecules.

Figure 15:
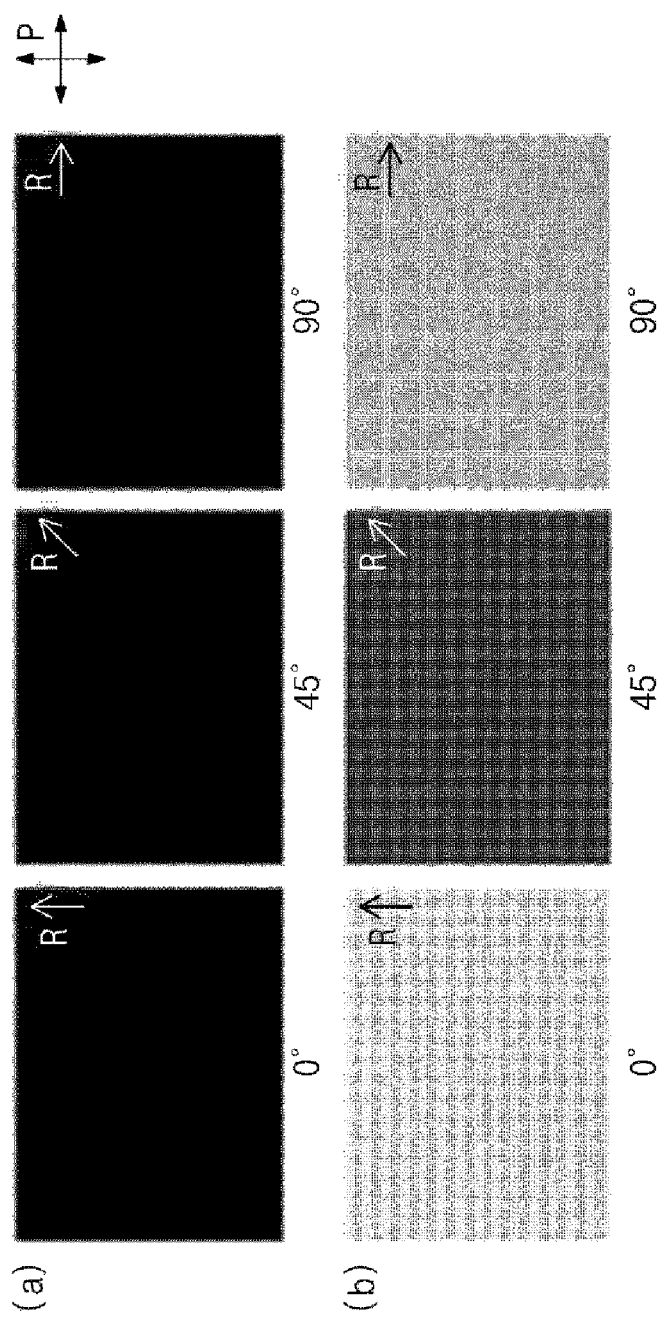
FIGS. 15 (a) and 15 (b) are views illustrating an influence on formation of a spiral structure of light emitting molecules by a heat treatment process according to an embodiment of the present disclosure.

Meanwhile, although omitted in the description of the first embodiment and the second embodiment, a heat treatment process was performed such that the R5011 chiral dopant provides a spiral structure to the light emitting molecules of F8BT when the inventors prepared the first embodiment and the second embodiment. FIGS. 15 (a) and 15 (b) will be referenced for a description of the heat treatment process.

FIGS. 15 (a) and 15 (b) are views illustrating an influence on formation of a spiral structure by a heat treatment process according to an embodiment of the present disclosure.

Referring to FIG. 15 (a), it was identified that the F8BT light emitting molecules is not made to have a spiral structure only by the R5011 chiral dopant in the light emitting molecules simply including F8BT. The red indication of FIG. 15 (a) indicates to the orientation direction of the light emitting layer, and the angle of FIG. 15 (a) indicates an angle between the polarization direction of the polarizing layer and the orientation direction. As illustrated in FIG. 15 (a), it can be seen that there is no change in the intensity of light in spite that the orientation direction and the polarization direction change. This means that the light emitting molecules are in an isotropic state in which they are not aligned.

Unlike this, referring to FIG. 15 (b), it is shown that the light emitting molecules have a spiral lamination structure due to the chiral dopant when the light emitting molecules including F8BT are annealed at 140 degrees or more and are cooled at room temperature in a state in which the R5011 chiral dopant is included in the light emitting molecules. In more detail, when a phase is transited to a mesophase and then cooling is performed through heat annealing, the light emitting molecules may have a spiral lamination structure. As illustrated in FIG. 15 (b), it can be identified that when the orientation direction and the polarization direction change, the intensity of exiting light changes. This means that the light emitting molecules are aligned in a spiral lamination structure by the HTP provided by the chiral dopant through heat treatment.

It is apparent that the heat treatment process described with reference to FIGS. 15 (a) and 15 (b) may be applied to the first embodiment and the modifications thereof, and the second embodiment and the modifications thereof, which have been described above.

Hereinafter, the effects of the present disclosure will be described in summary with reference to FIGS. 16 (a) and 16 (b)

Figure 16:
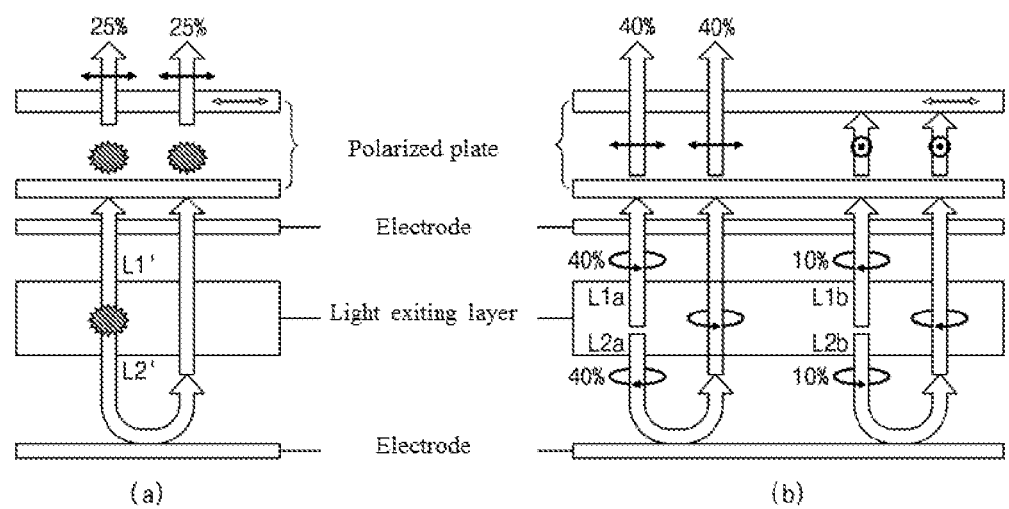
FIGS. 16 (a) and 16 (b) are views illustrating effects of the embodiments of the present disclosure.

FIGS. 16 (a) and 16 (b) are views illustrating effects of the embodiments of the present disclosure.

FIG. 16 (a) illustrates a conventional display, and FIG. 16 (b) illustrates a display according to an embodiment of the present disclosure. In common, the displays of FIGS. 16 (a) and 16 (b) may provide an external light reflecting function.

However, they show a significant difference in light exiting efficiency. In the conventional display illustrated in FIG. 16 (a), the light generated in the light exiting layer includes 50% of first light L1' that faces an exit surface, and 50% of second light L2' that faces a lower electrode. Then, the first light L1' and the second light L2' do not have a specific polarization state. In this case, only 25% of the first light L1' corresponding to 50% of the entire generated light may pass through the circular polarizing layer. That is, when the circular polarizing layer is a right circular polarizing layer, only the half of the light having the right circular polarization state, among the first light L1', can pass through the circular polarization layer. In the same principle, only 25% of the first light L2' corresponding to 50% of the entire generated light may pass through the circular polarizing layer. Accordingly, the exit efficiency of the conventional display was only 50%.

In contrast, in the display according to the embodiment of the present disclosure illustrated in FIG. 16 (a), because the light emitting molecules have a spiral lamination structure due to the chiral dopant, light polarized in a specific direc- tion is generated. That is, the light that faces the exit surface corresponding to 50% of the entire generated light includes L1a having a clockwise polarization state corresponding to 40% and L1b having a counterclockwise polarization state corresponding to 10%. That is, the light that faces the lower electrode corresponding to 50% of the entire generated light includes L2a having a counterclockwise polarization state corresponding to 40% and L1b having a clockwise polarization state corresponding to 10%. In this case, the light having the clockwise polarization state of L1a and L2a, that is, 80% of the entire light may pass through the right circular polarizing layer. Accordingly, in the display according to the embodiment of the present disclosure, the exit efficiency is 80%, which is enhanced by 60% as compared with the conventional display.

Moreover, according to an embodiment of the present disclosure, a chiral dopant is included such that the light emitting molecules have a spiral lamination structure. Unlike this, if the light emitting molecule themselves have a spiral structure or a dopant having a spiral structure is simply added, there occurs a limit in that the g-factor that is a polarization ratio is low and a design for adjusting the color of light is necessary. However, in the embodiment of the present disclosure, because the chiral dopant rotates the light emitting molecules themselves, the light emitting molecules have a layered spiral structure. Accordingly, the g-factor that is a polarization ratio significantly increases and the process becomes easier.

Meanwhile, according to the above-described embodiments of the present disclosure, it has been described that the chiral material is included in at least one layer of the light exiting layer. Unlike this, the film including the chiral material may be laminated between individual layers of the light exiting layer.

Until now, the displays according to the first and second embodiments of the present disclosure and the modifications thereof have been described with reference to FIGS. 1 to 16. Hereinafter, the structures and method for enhancing the g-factors of the above-described embodiments and modifications may be introduced with reference to FIGS. 17 to 21. Then, the g-factor may be defined in the following equation.

$$G\text{-factor:} \frac{2(IL - IR)}{IL + IR}$$

(IL: intensity of left-circular polarization, IR: intensity of right-circular polarization)

Hereinafter, the structure and method for enhancing the g-factor will be described.

Hereinafter, a method for manufacturing a rotary polarized light emitting device that provides an enhanced g-factor will be described with reference to FIG. 17.

Figure 17:
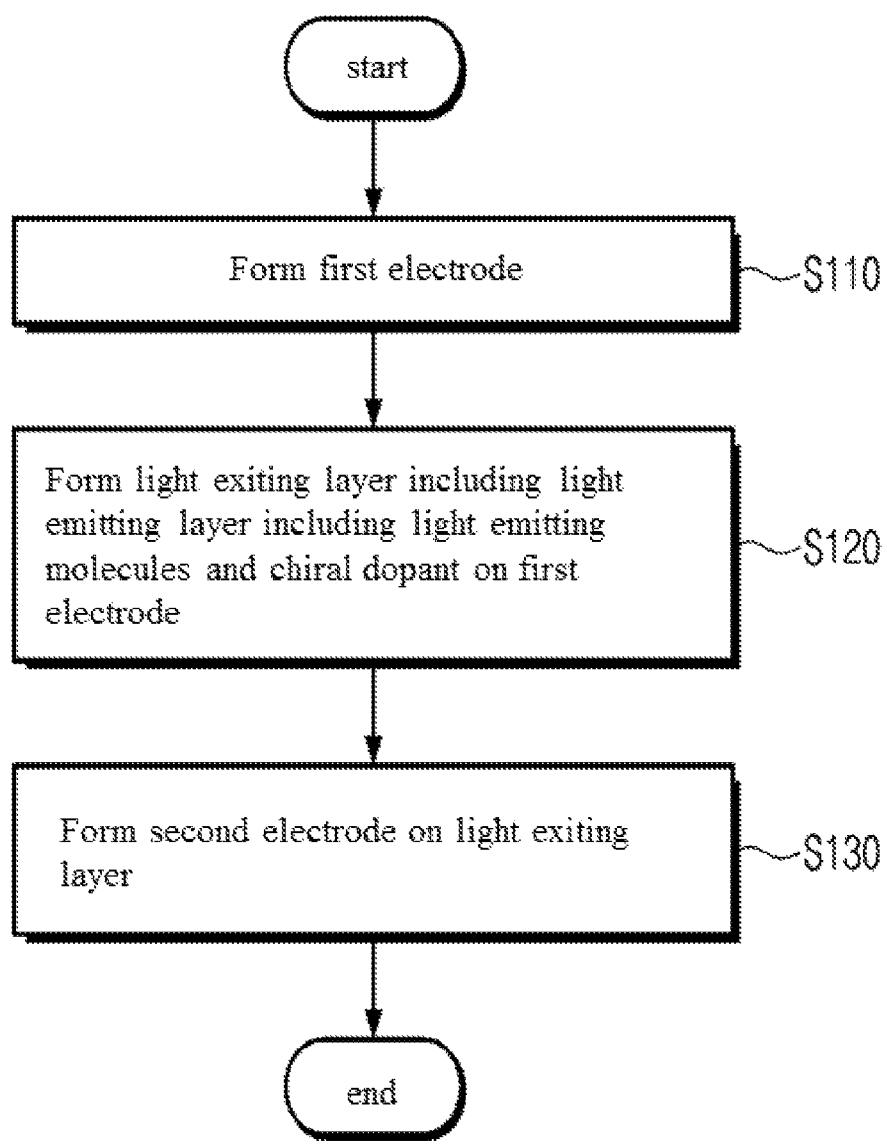
FIG. 17 is a view illustrating a method for manufacturing a rotary polarized light emitting device according to an embodiment of the present disclosure.

FIG. 17 is a view illustrating a method for manufacturing a rotary polarized light emitting device according to an embodiment of the present disclosure. Although it is assumed, for convenience of description, that the manufacturing method described with reference to FIG. 17 is the methods for manufacturing a rotary polarized light emitting device, which has been described with reference to FIGS. 1 to 3, it is apparent that it may be applied to the rotary polarized light emitting devices described with reference to FIGS. 4 and 16.

Referring to FIG. 17, the method for manufacturing a rotary polarized light emitting device according to an embodiment of the present disclosure may include at least one of a step S110 of forming a first electrode, a step S120 of forming a light exiting layer including a light emitting layer including light emitting molecules and a chiral dopant on the first electrode, and a step S130 of forming a second electrode on the light exiting layer. Hereinafter, the steps will be described.

In step S110, a first electrode may be formed. To achieve this, a substrate may be prepared first. A driving layer including at least one transistor that controls pixels through a photolithographic process and at least one capacitor may be formed on the substrate. A first electrode 110 may be formed on the driving layer through a photolithographic process or a liquid phase process. Accordingly, the first electrode 110 illustrated in FIG. 1 may be formed.

In step S120, a light exiting layer may be formed on the first electrode. Then, the light exiting layer may be coated through a solution process, that is, a soluble process when organic molecules are high molecules. Unlike this, when the organic molecules are low molecules, they may be deposited through a vapor deposition process. The chiral material may be formed together with the light exiting layer, for example, the light emitting layer.

For example, an electrode injection layer, an electrode transporting layer, the light emitting layer, an electron transporting layer, and an electron injection layer may be sequentially formed on the first electrode. Accordingly, the light exiting layer 105 illustrated in FIG. 1 may be formed.

In step S120, in order to provide the enhanced g-factor, at least one of the index of refraction of the light exiting layer, the twist angle of the light emitting molecules, an emission zone, and a linear polarization state may be controlled.

Then, the control of the index of refraction of the light exiting layer may be defined as the index of refraction of the above-described light exiting layer. The index of refraction of the light exiting layer may be defined according to the kind of the material that constitutes the light exiting layer.

The twist angle of the light emitting molecules may mean an angle by which the light emitting molecules are twisted in a layered shape by helical twisting power provided by the chiral dopant. The twist angle of the light emitting molecules may be defined according to the kind of the dopant and the concentration of the dopant.

As the twist angle of the light emitting molecules increases, the g-factor may have the shape of a sine waveform. According to an embodiment, the twist angle of the light emitting molecules may be defined as a twist angle having a g-factor that is larger than that of the second peak in a twist angle range corresponding to the first peak of the sine waveform. Further, the twist angle of the light emitting molecules may be controlled to 180 degrees or less.

The light emission zone may refer to a zone in which electrons and holes meet each other to generate light in the light emitting layer. For example, in the bottom emission method described with reference to FIG. 1, the g-factor increases as the light emission zone is closer to the electron transporting layer 150. To achieve this, the light emission zone may be moved toward the electron transporting layer 150 through the hole transporting layer 130. In another aspect, when the first electrode 110 is a transparent electrode and the second electrode 170 is a reflective electrode, the light emission zone of the light emitting layer may be controlled to be close to the second electrode 170. In more detail, the light emission zone of the light emitting layer may be controlled to be close to the second electrode 170 within 20% as compared with the thickness of the light emitting layer.

The linear polarization state means that the light generated in the light emitting layer 140 has a linear polarization state. This considers a phenomenon in which the g-factor increases when the light in the linear polarization state generated in the light emitting layer 240 is transited to a rotary polarization state while passing through the spiral lamination structure of the light emitting molecules described with reference to FIG. 2B.

The light emitting molecules that constitute the light emitting layer 140 have to be oriented in order that the light emitting layer 140 generates a linear polarization, and a method for orienting light emitting molecules will be described.

In order to align the light emitting molecules of the light emitting layer 140, an adjacent layer that interfaces with the light emitting layer 140 may be oriented in a specific direction. For example, the hole transporting layer 130 formed earlier than the light emitting layer 140 may be oriented in a specific direction. Because a surface of the hole transporting layer 130 is aligned in a specific direction, the alignment of the light emitting layer 140 that interfaces with the hole transporting layer 130 may be guided to a specific direction.

For example, the hole transporting layer 130 may be aligned in a specific direction through rubbing. Unlike this, the hole transporting layer 130 may be aligned in a specific direction through orientation of the light that irradiates the linearly polarized light. Hereinafter, for convenience of description, a case of orientation of light is assumed.

For orientation of light, the hole transporting layer 130 may further include a high-molecular material selected form a group including polyimide, polyamic acid, polynorbornene, a penyl maleimide copolymer, polyvinylcinnamate, polyazobenzene, polyethyleneimine, polyvinyl alcohol, polyamide, polyethylene, polystylene, polyphenylenephthalamide, polyester, polyurethane, polysiloxanecinnamate, cellulosecinnamate based compound, and polymethyl methacrylate based compound. That is, the optically oriented material may be further included in the hole transporting material described with reference to FIG. 1. Unlike this, the hole transporting layer 130 may include only an optically oriented material.

In step S130, a second electrode may be formed. The second electrode 170 may be formed through a photolithographic process or a liquid phase process. Accordingly, the second electrode 170 illustrated in FIG. 1 may be formed.

Until now, the method for manufacturing a rotary polarized light emitting device according to an embodiment of the present disclosure has been described with reference to FIG. 17. Hereinafter, the experimental examples of the present disclosure and the excellence of the present disclosure will be described.

FIGS. 18 to 23 are graphs depicting rotary polarization ratios (g-factors) according to the twist angles of the light emitting molecules according to an embodiment of the present disclosure.

First, a rotary polarized light emitting device including ITO (thickness: 100 nm, the first electrode)/CuPC (thickness: 2 nm, the hole injection layer)/polyimide (thickness: 20 nm, the orientation layer, and the hole transporting layer)/F8BT (the light emitting molecules)+R5011 (the chiral dopant) (thickness: 200 nm)/TPBi (thickness: 20 nm, the hole blocking layer)/LiF:Al (1 nm:70 nm, the second electrode) was prepared. Further, the light emitting molecules including F8BT were annealed to 140 degrees or more in a state in which an R5011 chiral dopant is included, and the spiral lamination structure according to an embodiment of the present disclosure was given to the light emitting molecules. Further, the light emitting molecules were made to be orientated by rubbing the hole transporting layer.

Then, the index of refraction of the light exiting layer was 0.67, and the light emission zone is 0 nm, which corresponds to an interface between the light emitting layer and TPBi. In another aspect, the interface of the light emitting layer and TPBi was defined as a reference line of the light emission zone.

Figure 18:
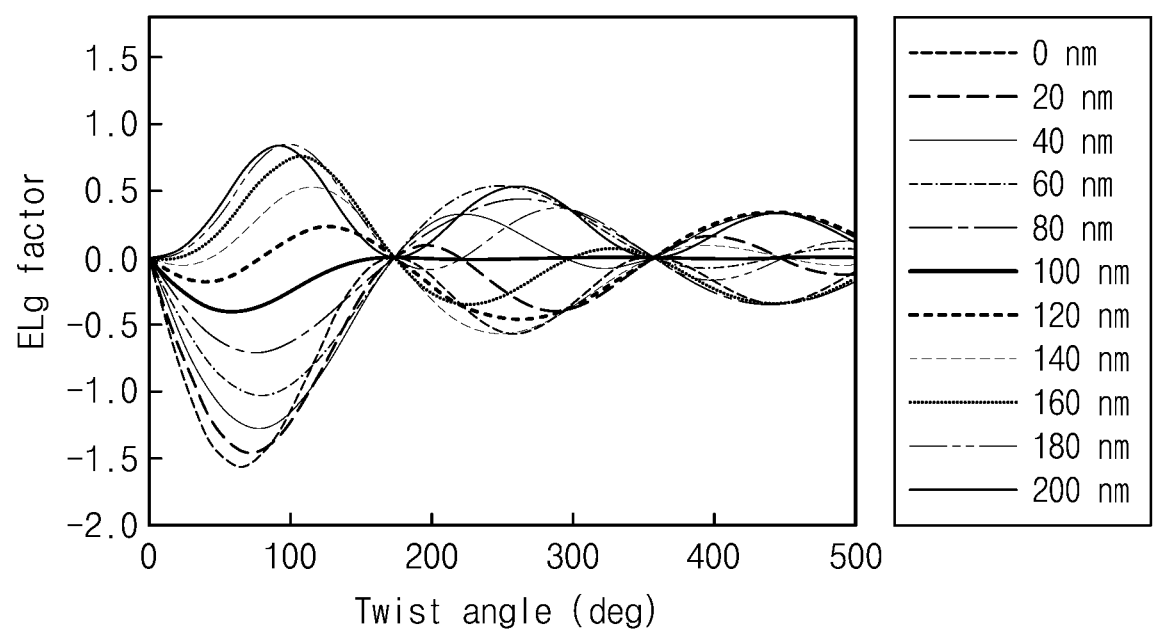
FIGS. 18 to 23 are graphs depicting rotary polarization ratios according to the twist angles of the light emitting molecules according to an embodiment of the present disclosure.

In the experimental result, as illustrated in FIG. 18, it appeared that the g-factor repeatedly increases and decreases in the form of a sine waveform as the spiral layered twist angle of the light emitting molecules increases. Accordingly, it was identified that it is preferable that the spiral layered twist angle may be 180 degrees or less such that a smaller amount of the chiral dopant is included.

Further, the twist angle may be defined as a value that is larger than the g-factor peak of the second peak in the first peak. For example, when the light emission zone is 0 nm, the twist angle may be a value between 14.73 and 127.31. Accordingly, the maximum g-factor may be derived with a minimum twist angle.

Figure 19:
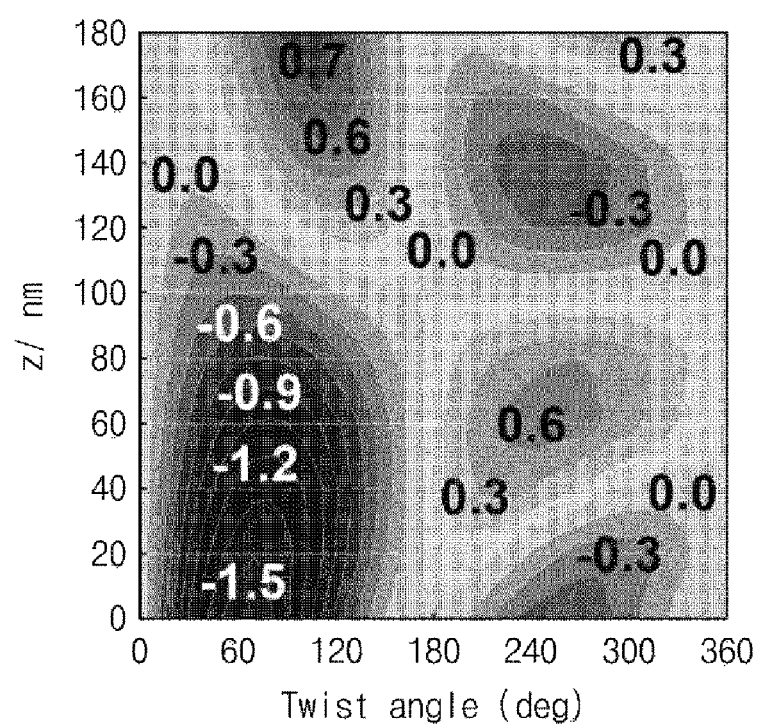

Further, it was identified that the g-factor is influenced by the location of the light emission zone. In FIGS. 18 and 19, the g-factor of a negative number means that the left-circular polarization is more dominant than the right-circular polarization and the g-factor of a positive number means that the right-circular polarization is more dominant than the left-circular polarization, and it can be identified from the absolute values of the g-factor that the case in which the location of the light emission zone is 0 nm is most dominant.

Further, the location of the light emission zone is controlled in a state in which the other factors are maintained constantly, and it can be identified that the polarization state of the light generated in the light emitting layer may be controlled to the left-circular polarization or the right-circular polarization.

Figure 20:
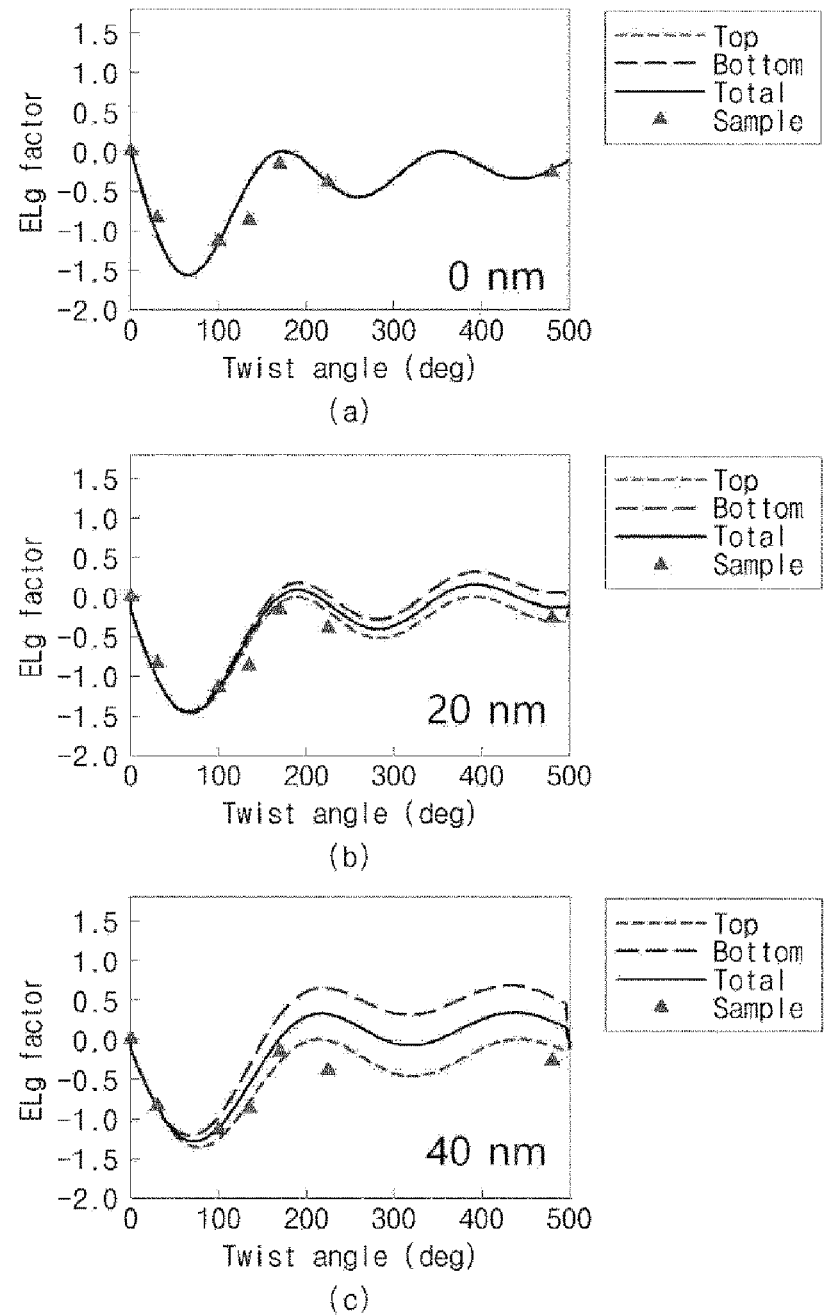

Meanwhile, referring to FIGS. 20 (*a*), 20 (*b*), 20 (*c*), 21 (*a*), 21(*b*), 21 (*c*), 22 (*a*), 22 (*b*), 22 (*c*), 23 (*a*) and 23 (*b*), the polarization states of Lin1 (denoted by top in FIGS. 20 (*a*), 20 (*b*), 20 (*c*), 21 (*a*), 21 (*b*), 21 (*c*), 22 (*a*), 22 (*b*), 22 (*c*), 23 (*a*) and 23 (*b*)) and Lin2 (denoted by bottom in FIGS. 20 (*a*), 20 (*b*), 20 (*c*), 21(*a*), 21(*b*), 21 (*c*), 22 (*a*), 22 (*b*), 22 (*c*), 23 (*a*) and 23 (*b*)) can be identified with reference to the case in which Lin1 and Lin2 are viewed from the exit surface for the locations of the light emission zones. Referring to FIG. 19, it can be identified that the polarization states of Lin1 and Lin2 are similar until the first furrow of the g-factor when the location of the light emission zone is 0 nm to 40 nm. In this case, it is expected with reference to FIG. 3 that the light efficiency can be maximized more smoothly. Accordingly, it is preferable that the location of the light emission zone is controlled to less than 40 nm that is less than 20% of the entire thickness of the light emitting layer of 200 nm in the direction of the hole transporting layer.

Until now, the simulation result on the influences of the location of the light emission zone and the twist angle on the g-factor has been described with reference to FIGS. 18 to 23.

Figure 21:
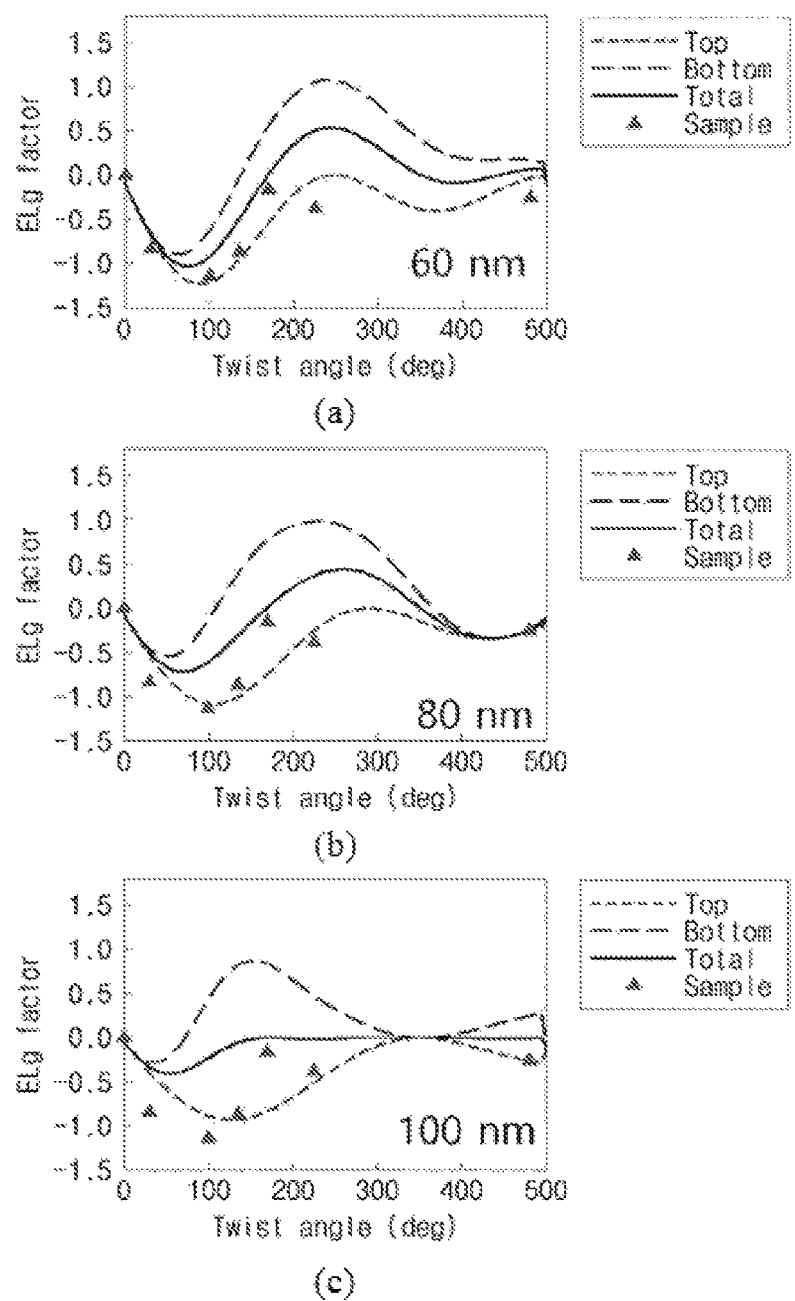
Figure 22:
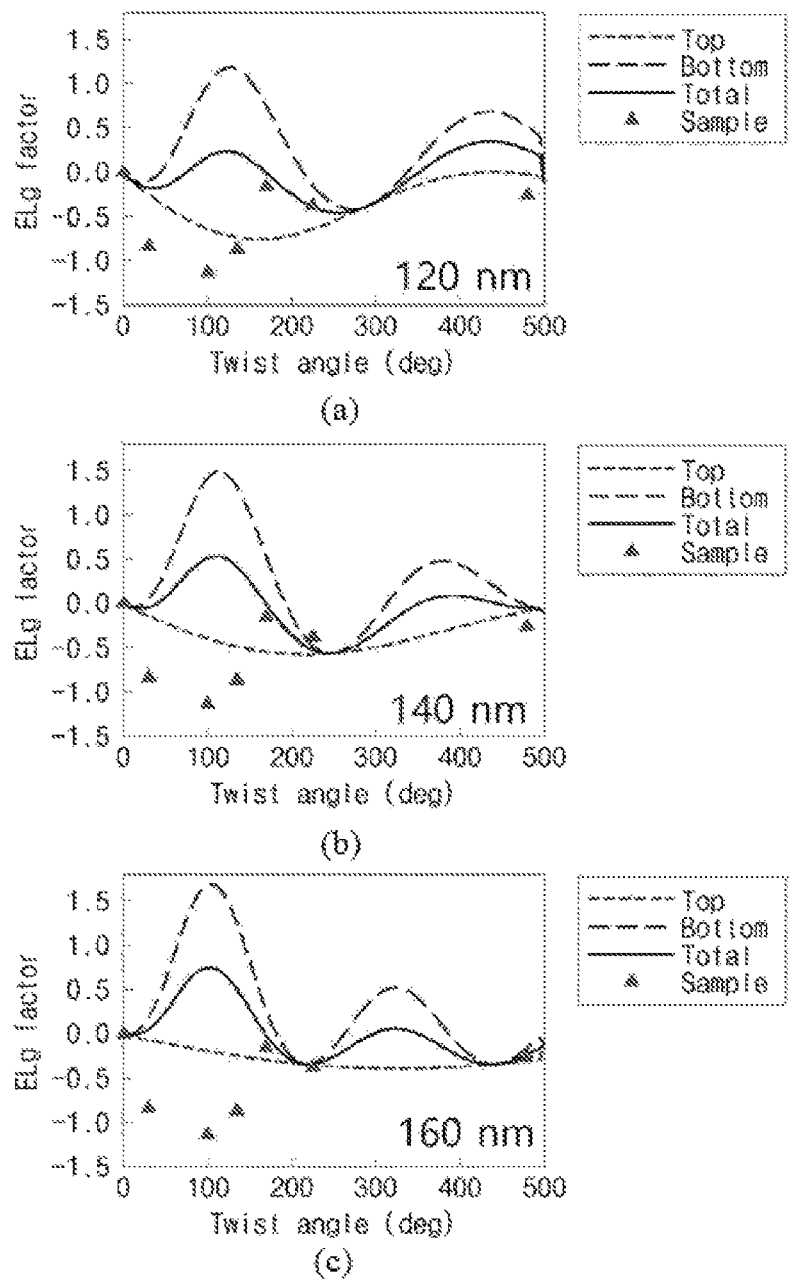
Figure 23:
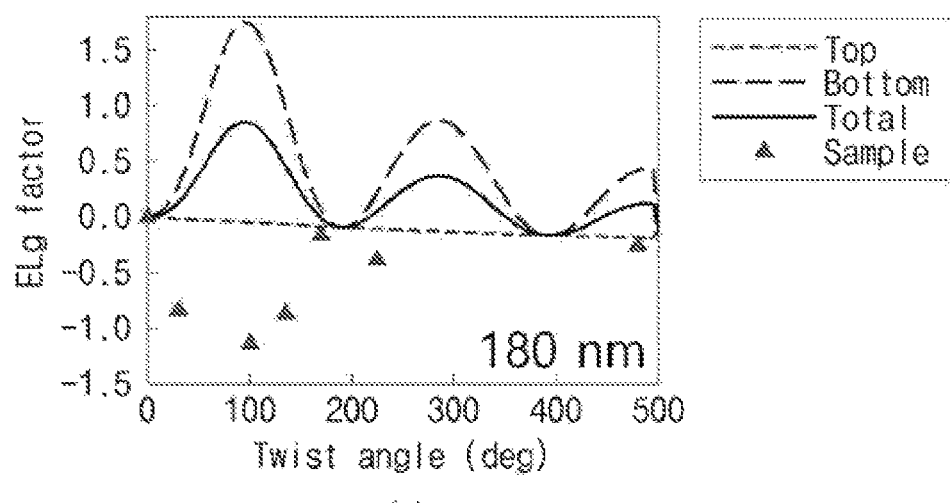
Figure 23:
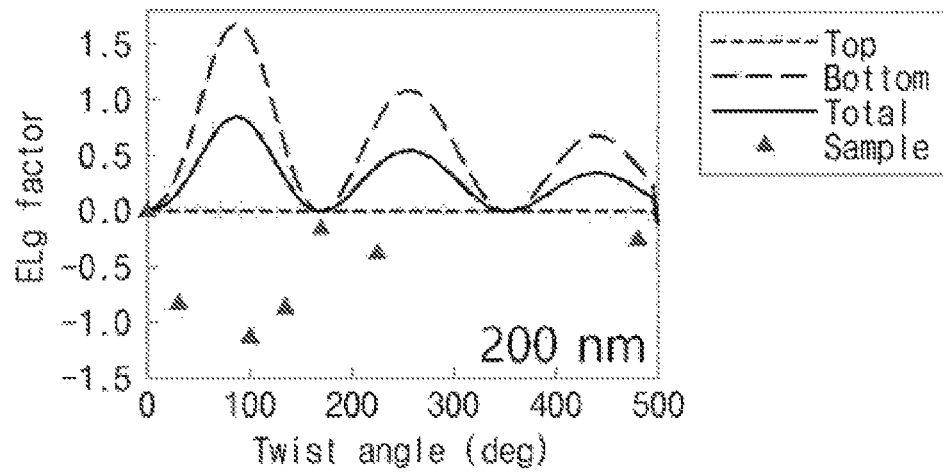
Figure 24:
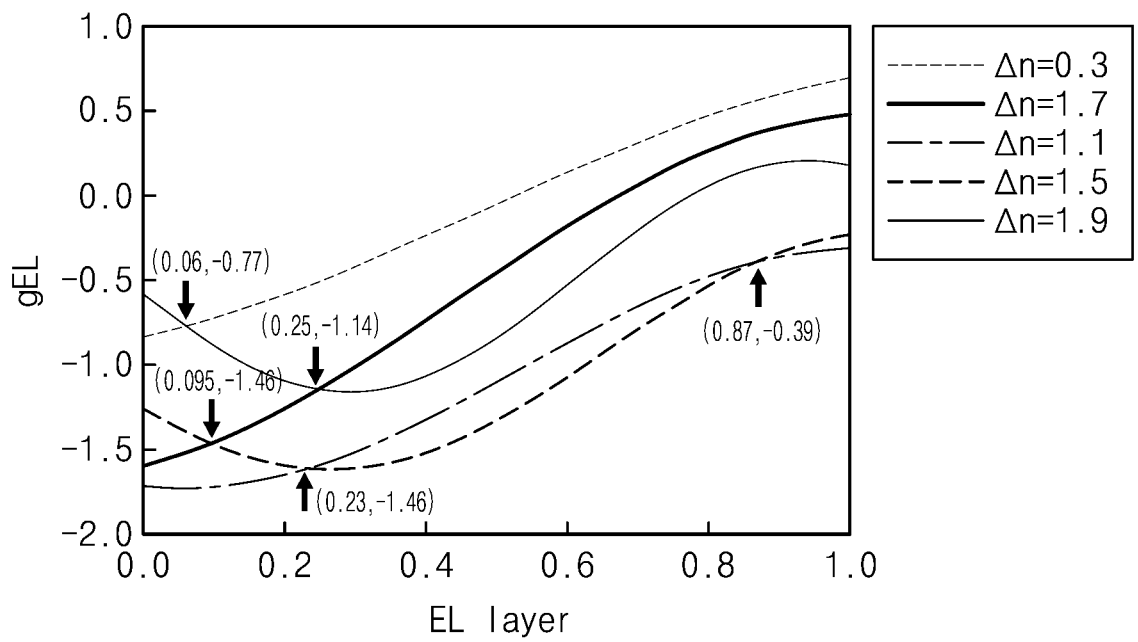
FIG. 24 is a graph illustrating rotary polarization ratios for the locations of a light emitting zone according to an embodiment of the present disclosure.

FIG. 21 is a graph illustrating rotary polarization ratios for the locations of a light emitting zone according to an embodiment of the present disclosure.

For the experiment, a rotary polarized light emitting device described with reference to FIGS. 18 to 23 was prepared. Then, the layered twist angle of the light emitting molecules by the chiral dopant was 60 degrees.

The transverse axis of FIG. 21 indicates the location of the light emission zone, and represents the ratio of the location of the light emission zone to the entire thickness of the light emitting layer of 200 nm. The case in which the value of the light emission zone is 0 means that the location of the generated light is an interface of the light emitting layer and TPBi, and the case in which the value of the light emission zone is 1.0 means that the location of the generated light is an interface of the light emitting layer and polyimide.

Referring to FIG. 21, it can be identified that the index of refraction differently influences the g-factor according to the location of the light emission zone. That is, it can be identified that the highest g-factor is provided when the index of refraction is 1.1 if the location of the light emission zone is 0 to 1.23, and it can be identified that the highest g-factor is provided when the index of refraction is 1.5 if the location of the light emission zone is 1.23 to 0.87.

According to the rotary polarized light emitting device and the method for manufacturing the same according to the embodiments of the present disclosure described above with reference to FIGS. 1 to 21, the light of the rotary polarization state can be generated by the light emitting molecules of the spiral lamination structure through a chiral dopant. Accordingly the optical efficiency can be enhanced by increasing the amount of light that may pass through the circular polarized plate for blocking external light.

According to the rotary polarized light emitting device and the method for manufacturing the same according to the embodiments of the present disclosure, the g-factor can be enhanced by controlling at least one factor of the index of refraction of the light exiting layer, the twist angle of the light emitting molecules, an emission zone, and a linear polarization state. Accordingly, the optical efficiency can be enhanced.

Further, according to the embodiments of the present disclosure, it is assumed that the light emitting layer is an organic light emitting layer, but may be an inorganic light emitting layer, for example, a quantum light emitting layer. In this case, the light emitting layer itself may be an organic light emitting layer. For example, the quantum light emitting layer may include a quantum dot and/or a quantum rod. In this case, the light emitting inorganic molecules such as a quantum dot and/or a quantum rod may have a spiral lamination structure due to the chiral dopant, and the spiral lamination structure may change the polarization state of the exiting light as described above. The quantum dot and the quantum rod may be a semiconductor material of a nano size, and may be one or more materials including a II-VI group, a III-VI group, a IV group, and a mixture thereof. In detail, the quantum dot and the quantum rod may include at least one material of magnesium oxide (MgO), magnesium sulfide (MgS), magnesium selenide (MgSe), magnesium telluride (MgTe), calcium oxide (CaO), calcium sulfide (CaS), calcium selenide (CaSe), calcium telluride (CaTe), strontium oxide (SrO), strontium sulfide (SrS), strontium selenide (SrSe), strontium telluride (SrTe), barium oxide (BaO), barium sulfide (BaS), barium selenide (BaSe), barium telluride (BaTE), zinc oxide (ZnO), copper oxide (Cu2O), zinc sulfide (ZnS), zinc selenide (ZnSe), zinc telluride (ZnTe), cadmium oxide (CdO), cadmium sulfide (CdS), cadmium selenide CdSe), cadmium telluride (CdTe), mercury oxide (HgO), mercury sulfide (HgS), mercury selenide (HgSe), mercury telluride (HgTe), aluminum sulfide (Al2S3), aluminum selenide (Al2Se3), aluminum telluride (Al2Te3), gallium oxide (Ga2O3), gallium sulfide (Ga2S3), gallium selenide (Ga2Se3), gallium telluride (Ga2Te3), indium oxide (In2O3), indium sulfide (In2S3), indium selenide (In2Se3), indium telluride (In2Te3), germanium oxide (GeO2), tin oxide (SnO2), tin sulfide (SnS), tin selenide (SnSe), tin telluride (SnTe), lead oxide (PbO), lead dioxide (PbO2), lead sufide (PbS), lead selenide (PbSe), lead telluride (PbTe), aluminum nitride (AlN), aluminum phosphide (AlP), aluminum arsenide (AlAs), aluminum antimonide (AlSb), gallium nitride (GaN), gallium phosphide (GaP), gallium arsenide (GaAs), gallium antimonide (GaSb), indium nitride (InN), indium phosphide (InP), indium arsenide (InAs), indium antimonide (InSb), boron phosphide (BP), silicon (Si) or germanium (Ge).

Further, in the description of the embodiment of the present disclosure, it is assumed that the light emitting layer is electroluminescent, but it is apparent that the technical spirit of the present disclosure may be applied to the case in which the light emitting layer is applied to photoluminescence.

Although the preferred embodiments of the present disclosure have been described in detail until now, the scope of the present disclosure is not limited to the embodiments and should be construed by the attached claims. Further, it should be understood that those skilled in the art to which the present disclosure pertains may variously correct and modify the present disclosure without departing from the scope of the present disclosure.

What is claimed is:

1. A rotary polarized light emitting device comprising:
a first electrode disposed in a light exiting direction;
a second electrode facing the first electrode;
a light exiting layer disposed between the first electrode and the second electrode, configured to exit, toward the first electrode, first light having a polarization state in which the first light rotates in a first direction, and exit, toward the second electrode, second light having a polarization state in which the second light rotates in a second direction that is opposite to the first direction; and
a polarizing layer disposed in the light exiting direction with respect to the first electrode, and configured to pass light that rotates in the first direction,
wherein the light exiting layer comprises a chiral material that adjusts layered distortion angles of light emitting molecules of the light exiting layer such that the first light exiting from the light emitting layer has a polarization state in which the first light emitting from the light exiting layer rotates in the first direction toward the first electrode and the second light emitted from the light emitting layer has a polarization state in which the second light rotates in the second direction toward the second electrode.

2. The rotary polarized light emitting device of claim 1, wherein the second light is reflected by the second electrode, and has a polarization state in which the second light rotates in the first direction to pass through the polarizing layer, and
wherein external incident light has a polarization state in which the external incident light rotates in the first direction as the external incident light passes through the polarizing layer, the external incident light having the polarization state in which the external incident light rotates in the first direction is reflected by the second electrode to have a polarization state in which the external incident light rotates in the second direction such that the exit of the external incident light is blocked by the polarizing layer.

3. The rotary polarized light emitting device of claim 1, wherein the first direction and the second direction are directions that are defined with reference to a point of view of viewing a second location from a first location on a light travel path that faces from the first location to the second location.

4. The rotary polarized light emitting device of claim 1, wherein the layered distortion angles are 180 degrees or less.

5. A rotary polarized light emitting body comprising:
non-chiral light emitting molecules; and a dopant configured to provide a distortion angle in a thickness direction of the light emitting molecules, and configured to laminate the light emitting molecules in a spiral structure.

6. The rotary polarized light emitting body of claim 5, wherein the dopant provides helical twisting power to the light emitting molecules such that the light emitting molecules rotate at the distortion angle.

7. A method for manufacturing a rotary polarized light emitting device, the method comprising:
forming a first electrode;
forming a light exiting layer comprising a light emitting layer comprising light emitting molecules and a chiral dopant on the first electrode; and
forming a second electrode on the light exiting layer,
wherein in the forming of the light exiting layer, a g-factor of light emitting from the light emitting layer is controlled by adjusting, by the chiral dopant, a layered distortion angle of the light emitting molecules.

8. The method of claim 7, wherein the forming of the light exiting layer comprises:
performing at least one of control of the layered distortion angle, control of an index of refractivity of the light exiting layer, and control of a light emitting zone of the light emitting layer, and
wherein the light emitting zone of the light emitting layer is defined with reference to a distance from at least one of the first and second electrodes.

9. The method of claim 8, wherein the layered distortion angle is controlled to 180 degrees or less.

10. The rotary polarized light emitting body of claim 9, wherein when the first electrode is a transparent electrode and the second electrode is a reflective electrode, the light emitting zone of the light emitting layer is controlled to be close to the second electrode.

11. The method of claim 10, wherein the light emitting zone of the light emitting layer is controlled to be closer to the second electrode within 20% of a thickness of the light emitting layer.

12. The method of claim 8, wherein the index of refractivity of the light exiting layer is controlled according to a location of the light emitting zone of the light emitting layer.

* * * * *